US011211342B1

(12) United States Patent
Lu

(10) Patent No.: US 11,211,342 B1
(45) Date of Patent: Dec. 28, 2021

(54) MULTIPLEXER CELL AND SEMICONDUCTOR DEVICE HAVING CAMOUFLAGE DESIGN, AND METHOD FOR FORMING MULTIPLEXER CELL

(71) Applicant: TAIWAN SEMICONDUCTOR MANUFACTURING COMPANY LTD., Hsinchu (TW)

(72) Inventor: Shih-Lien Linus Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/934,782

(22) Filed: Jul. 21, 2020

(51) Int. Cl.
*H01L 23/00* (2006.01)
*H01L 21/8238* (2006.01)
*H01L 23/528* (2006.01)
*H01L 27/092* (2006.01)

(52) U.S. Cl.
CPC .... *H01L 23/573* (2013.01); *H01L 21/823871* (2013.01); *H01L 23/528* (2013.01); *H01L 23/576* (2013.01); *H01L 27/092* (2013.01)

(58) Field of Classification Search
CPC .......... H01L 21/823871; H01L 23/573; H01L 23/528; H01L 23/576; H01L 27/092; H01L 2924/1431; H01L 2924/1425–14252
See application file for complete search history.

(56) References Cited

U.S. PATENT DOCUMENTS

2003/0205816 A1\* 11/2003 Janke ............... G06K 19/07363
257/758
2017/0083653 A1\* 3/2017 Sahu ................... H01L 27/0207

\* cited by examiner

*Primary Examiner* — Herve-Louis Y Assouman
(74) *Attorney, Agent, or Firm* — WPAT, P.C., Intellectual Property Attorneys; Anthony King

(57) ABSTRACT

A semiconductor device includes a semiconductor substrate, a conductive segment, a conductive layer, a first contact element and a second contact element. The semiconductor substrate includes an active region. The conductive segment is formed on the semiconductor substrate, and extends across the active region. The conductive layer is formed over the semiconductor substrate and the conductive segment. The first contact element, formed between the conductive segment and a first conductive portion of the conductive layer, is arranged to electrically connect the conductive segment to the first conductive portion. The second contact element is formed between the conductive segment and a second conductive portion of the conductive layer. The first contact element and the second contact element are formed on the conductive segment and spaced apart from each other. The second contact element is arranged to electrically isolate the conductive segment from the second conductive portion.

20 Claims, 12 Drawing Sheets

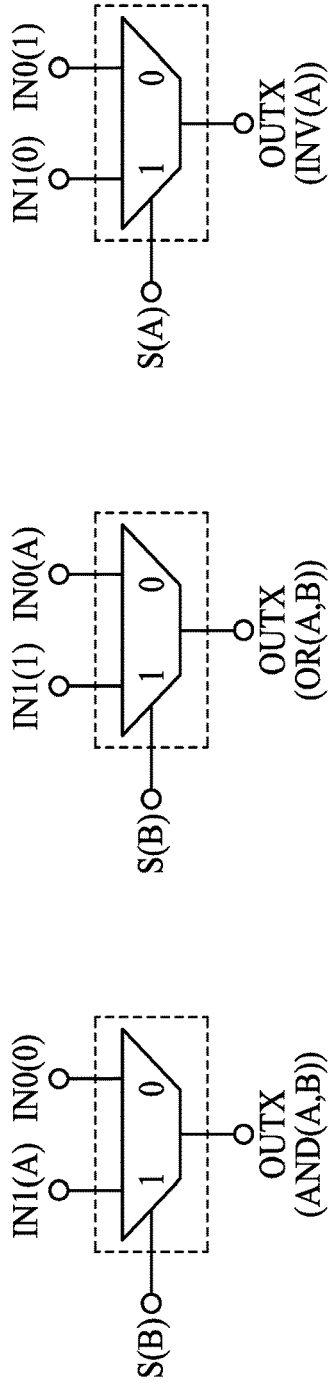
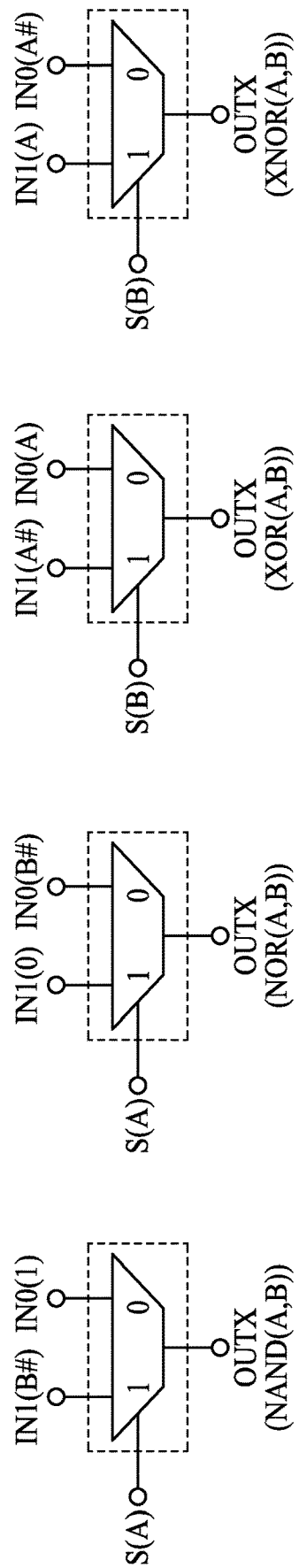

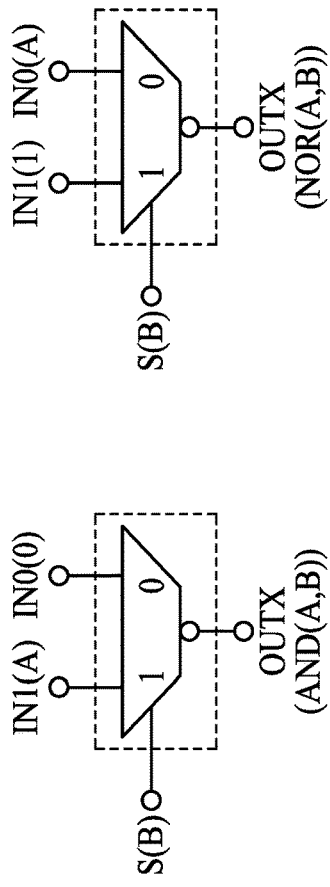
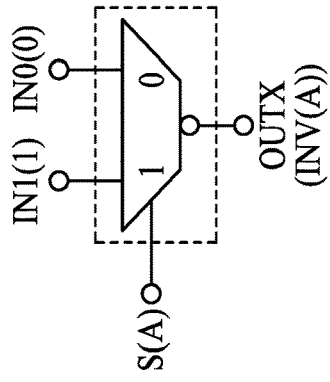
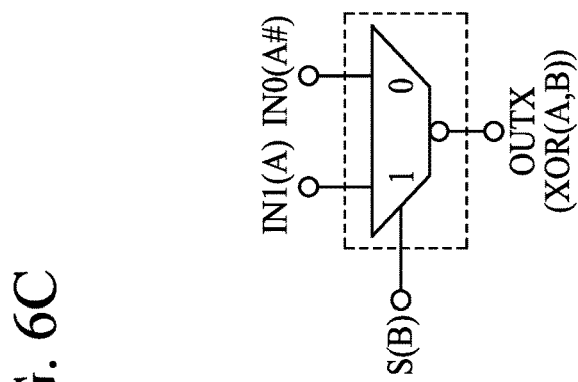
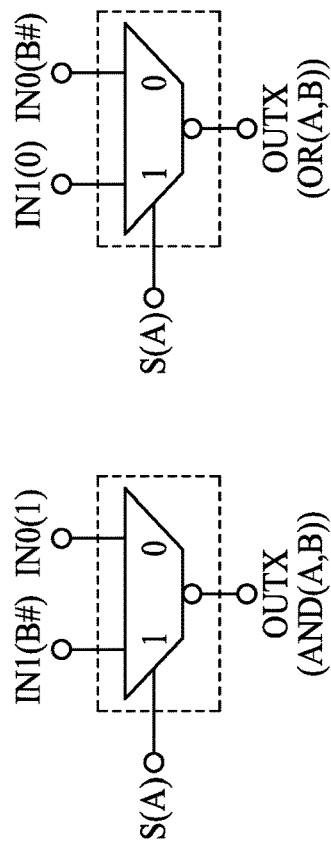
FIG. 6A FIG. 6B FIG. 6C FIG. 6D FIG. 6E FIG. 6F FIG. 6G

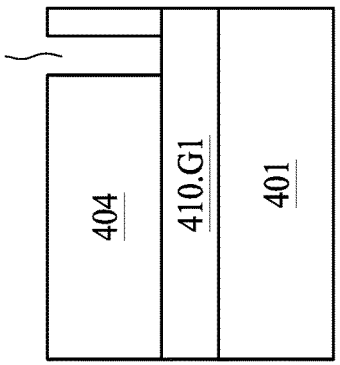
FIG. 10A
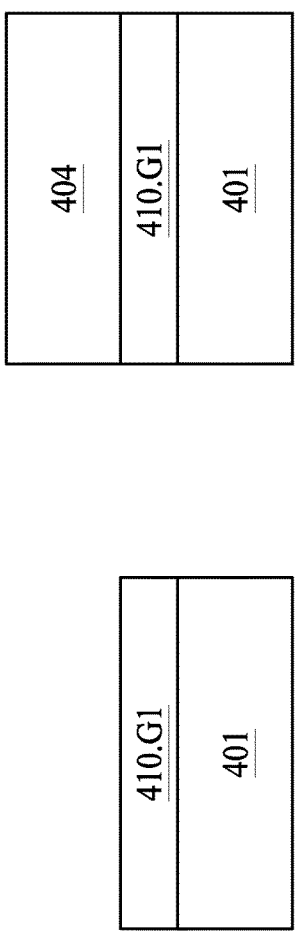
FIG. 10B
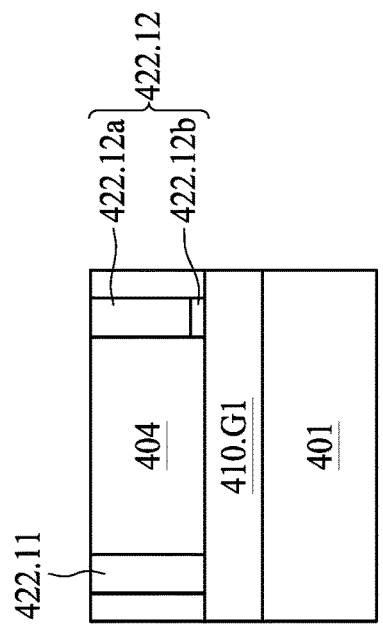
FIG. 10C
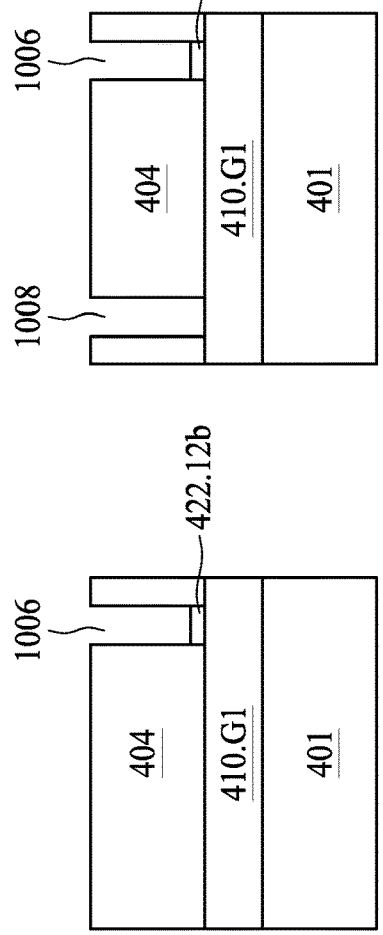
FIG. 10D
FIG. 10E
FIG. 10F

MULTIPLEXER CELL AND SEMICONDUCTOR DEVICE HAVING CAMOUFLAGE DESIGN, AND METHOD FOR FORMING MULTIPLEXER CELL

CROSS REFERENCE TO RELATED APPLICATIONS

This application is related to applicant's previously filed U.S. application Ser. No. 16/869,916, filed May 8, 2020, which is herein incorporated by reference.

BACKGROUND

The present disclosure relates to semiconductor device design and, more particularly, to a multiplexer cell, a semiconductor device having a camouflage design, and a method for forming a semiconductor device.

Reverse engineering (RE) of electronic chips is a process of examining and analyzing circuit components contained in an integrated circuit (IC) so as to reveal the structure and functionality of each circuit component. With the reverse engineering techniques, attackers may be able to steal the design intellectual property (IP). The reverse engineering process associated with circuit extraction may include package removal, delayering and image processing. Package removal can etch off packages without damaging the die. Delayering can extract the physical interconnection information layer-by-layer. Imaging processing can obtain optical images of each circuit layer and reconstruct the structure of circuit components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3G illustrate different logic gates implemented using the multiplexer cell shown in FIG. 2 in accordance with some embodiment of the present disclosure.

FIG. 6A to FIG. 6G illustrate different logic gates implemented using the multiplexer cell shown in FIG. 5 in accordance with some embodiment of the present disclosure.

FIG. 10A to FIG. 10F illustrate cross sections, taken along the line in FIG. 4A, of corresponding structures at different stages of fabrication in accordance with some embodiments of the present disclosure.

DETAILED DESCRIPTION

Figure 1:
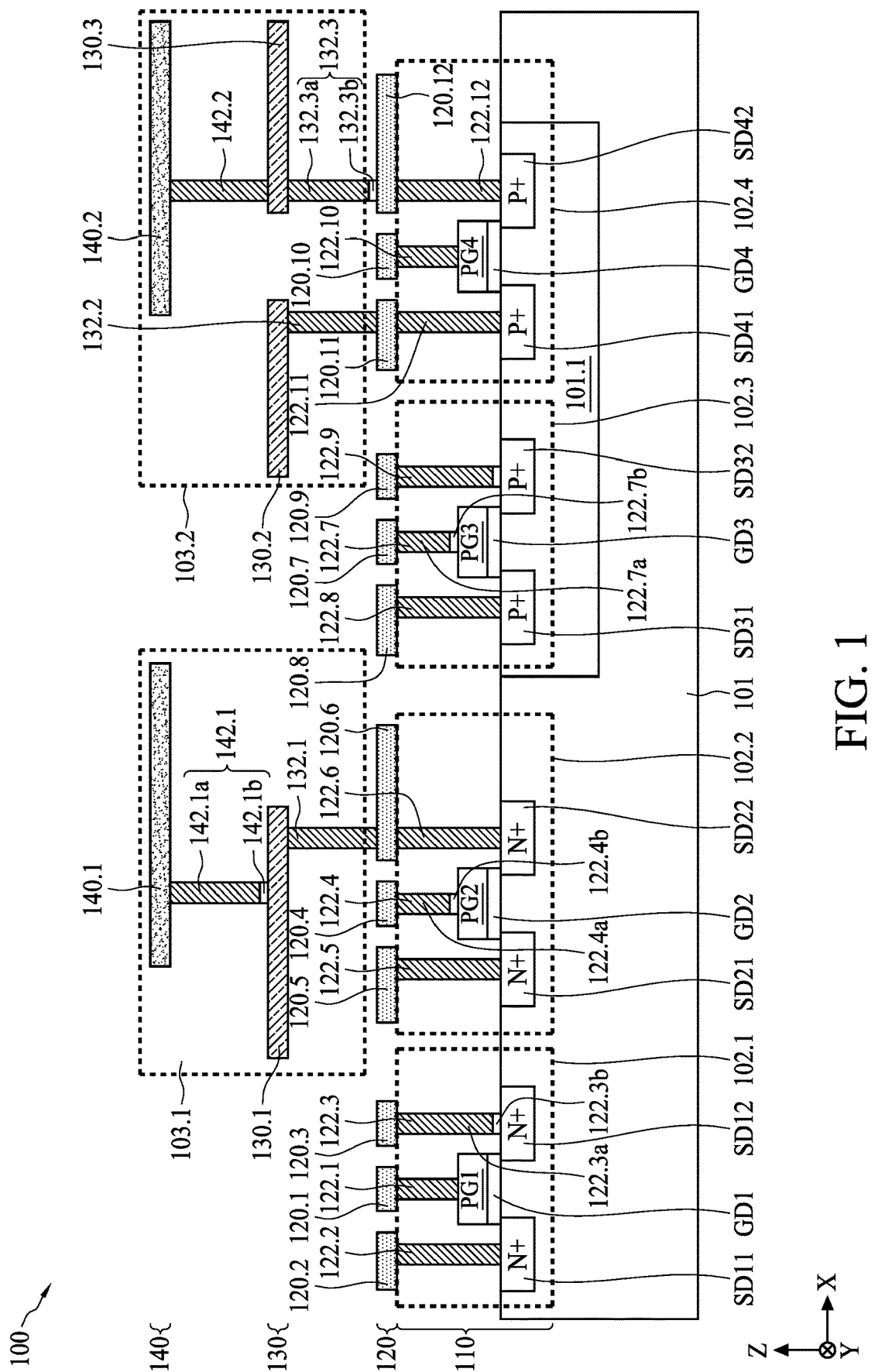
FIG. 1 illustrates an exemplary semiconductor structure utilizing fake contacts to provide a camouflage design in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, it will be understood that when an element is referred to as being "connected to" or "coupled to" another element, it may be directly connected to or coupled to the other element, or intervening elements may be present.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To fend off reverse engineering attacks, different types of logic gates may be made to look alike to thereby hide circuit functionality. For example, a group of look-alike logic gates may be constructed. Some logic gates in a circuit design can be replaced with the group of look-alike logic gates to disguise actual circuit functionality. However, as the number of logic gates that can be replaced with the group of look-alike logic gates is limited, there may be a slight chance for an attacker to guess actual functionality of the circuit design. One or more algorithms would be used to analyze which logic gates in the circuit design could be replaced so as to reduce the risk of leaking information through reverse engineering.

The present disclosure describes exemplary semiconductor devices, each of which has a camouflage design implemented using a universal gate such as a multiplexer cell.

Each of logic circuits included in the semiconductor device can be constructed by leveraging the universal gate. When an attacker attempts to reverse engineer the semiconductor device, it is hard to decipher the actual design of the semiconductor device since the logic circuits has a generic layout structure in each stage of delayering. For example, the universal gate may include a plurality of contact elements formed between different layers, such as a transistor layer, a conductive layer or other types of semiconductor layers. At least one of the contact elements, referred to as a real contact, is arranged to electrically connect one layer to another. At least one of the contact elements, referred to as a fake contact, is arranged to electrically isolate one layer from another. With the use of fake contacts, the logic circuits can be implemented as a plurality of camouflaged circuits respectively. The camouflaged circuits may have the same arrangement of contact elements, while the arrangement of fake contacts in one camouflaged circuit may be different from that in another camouflaged circuit. As a result, it is hard to recognize whether a contact element, when viewed from a top of a semiconductor substrate, is a real contact or a fake contact in each stage of delayering. The attacker cannot easily discover actual functionality of the semiconductor device.

Referring to FIG. 1, an exemplary semiconductor structure utilizing fake contacts to provide a camouflage design is illustrated in accordance with some embodiments of the present disclosure. The semiconductor structure 100 may include, but is not limited to a transistor layer 110, a conductive layer 120 and a plurality of interconnect structures 103.1 and 103.2. In the present embodiment, the transistor layer 110 may include a plurality of transistor structures 102.1-102.4. Each of the transistor structure 102.1 and 102.2 may be implemented to include an n-channel transistor formed on a semiconductor substrate 101. Each of the transistor structure 102.3 and 102.4 may be implemented to include a p-channel transistor formed on an n-well region 101.1 in the semiconductor substrate 101.

The transistor structure 102.1 includes a gate dielectric GD1, a poly gate segment PG1, a plurality of source/drain regions SD11 and SD12, and a plurality of contact elements 122.1-122.3. The conductive layer 120, which may be a first metal layer (M0) formed on the transistor layer 110, includes a plurality of conductive portions 120.1-120.3 formed on the transistor structure 102.1. In the present embodiment, the gate dielectric GD1, the poly gate segment PG1 and the contact element 122.1 can be used to implement at least a portion of a gate structure of the transistor structure 102.1. The source/drain region SDI 1 and the contact element 122.2 can be used to implement at least a portion of a source/drain structure of the transistor structure 102.1. The source/drain region SD12 and the contact element 122.3 can be used to implement at least a portion of another source/drain structure of the transistor structure 102.1.

The gate dielectric GD1 is formed on the semiconductor substrate 101. The gate dielectric GD1 may include dielectric materials, such as silicon oxide, silicon nitride, silicon oxynitride, metal oxide, or a combination thereof. The poly gate segment PG1, formed on the gate dielectric GD1, may be implemented using a polysilicon segment or a polysilicon-germanium segment. In some embodiments, the poly gate segment PG1 may be replaced with other types of conductive segments such as a metal segment. In some embodiments, the poly gate segment PG1 may be replaced with a plurality of conductive segments stacked one upon another. The source/drain regions SD11 and SD12, located at opposite sides of the poly gate segment PG1, may be doped with n-type dopants to form N+ doped regions in the semiconductor substrate 101.

The contact element 122.1, formed on the poly gate segment PG1 and in contact with the conductive portion 120.1, is arranged to electrically connect the poly gate segment PG1 to the conductive portion 120.1 to thereby serve as a gate contact. The contact element 122.2, formed on the source/drain region SD11 and in contact with the conductive portion 120.2, is arranged to electrically connect the source/drain region SDI 1 to the conductive portion 120.2 to thereby serve as a source/drain contact. At least one of the contact elements 122.1 and 122.2 can be implemented as a conductive through via or other types of conductive structures. Each of the contact elements 122.1 and 122.2 can be formed using conductive material(s), such as Cu, Al, Ti, Ta, W, Nb, Mo, TiN, TiC, TaN, Ti/W, Ti/TiN, any other known conductive or semi-conductive materials, or combinations thereof.

The contact element 122.3, formed on the source/drain region SD12 and in contact with the conductive portion 120.3, is arranged to electrically isolate the source/drain region SD12 from the conductive portion 120.3. The contact element 122.3 can fake a source/drain contact disposed on the source/drain region SD12. For example, the contact element 122.3 may include a conductive segment 122.3a and a non-conductive segment 122.3b stacked one upon the other. A height of the non-conductive segment 122.3b is much less than a height of the conductive segment 122.3a. As a result, when viewed from a top of the conductive layer 120, or a plane cutting through the contact elements 122.1-122.3, in a stage of delayering in a reverse engineering process, the contact element 122.3 appears to be a real source/drain contact similar or identical to the contact element 122.2.

In the present embodiment, the conductive segment 122.3a may be stacked upon the non-conductive segment 122.3b. For example, the conductive segment 122.3a can be implemented as a conductive through via or other types of conductive structures formed on the non-conductive segment 122.3b. The conductive segment 122.3a can be formed using conductive material(s), such as Cu, Al, Ti, Ta, W, Nb, Mo, TiN, TiC, TaN, Ti/W, Ti/TiN, any other known conductive or semi-conductive materials, or combinations thereof. The non-conductive segment 122.3b may be implemented as an insulating film or other types of insulating structures. The insulating film may be a single-layer insulating film or a lamination-layer insulating film. By way of example but not limitation, the non-conductive segment 122.3b may be implemented as a thin insulating film having a thickness of 10 to 30 nm. The non-conductive segment 122.3b can be formed using insulating material(s), such as silicon oxide, silicon nitride, silicon oxynitride, metal oxide, metal nitride, other types of insulating materials, or combinations thereof. The non-conductive segment 122.3b can be formed using, but is not limited to, a deposition process such as thermal oxidation deposition or chemical vapor deposition (CVD).

In some embodiments, the non-conductive segment 122.3b can be formed between the conductive portion 120.3 and the conductive segment 122.3a, such that the non-conductive segment 122.3b is stacked upon the conductive segment 122.3a. In some embodiments, the contact element 122.3 may include at least one conductive segment and at least one non-conductive segment stacked one upon another. Associated modifications and alternatives also fall within the contemplated scope of the present disclosure.

The transistor structure 102.2 may be similar or identical to the transistor structure 102.1 except that the actual design of the transistor structure 102.2 is camouflaged with a fake gate contact. The transistor structure 102.2 includes a gate dielectric GD2, a poly gate segment PG2, a plurality of source/drain regions SD21 and SD22 and a plurality of contact elements 122.4-122.6. The gate dielectric GD2, the poly gate segment PG2 and the contact element 122.4 can be used to implement at least a portion of a gate structure of the transistor structure 102.2. The source/drain region SD21 and the contact element 122.5 can be used to implement at least a portion of a source/drain structure of the transistor structure 102.2. The source/drain region SD22 and the contact element 122.6 can be used to implement at least a portion of another source/drain structure of the transistor structure 102.2. In addition, a plurality of conductive portions 120.4-120.6 of the conductive layer 120 can be formed on the transistor structure 102.2.

In the present embodiment, the contact element 122.5 can serve as a source/drain contact, which is arranged to electrically connect the source/drain region SD21 to the conductive portion 120.5. The contact element 122.6 can serve as a source/drain contact, which is arranged to electrically connect the source/drain region SD22 to the conductive portion 120.6. The contact element 122.4, arranged to electrically isolate the poly gate segment PG2 from the conductive portion 120.4, can fake a gate contact disposed on the poly gate segment PG2. For example, a height of the non-conductive segment 122.4b is much less than a height of the conductive segment 122.4a. When viewed from a top of the conductive layer 120, or a plane cutting through the contact elements 122.4-122.6, in a stage of delayering in a reverse engineering process, the contact element 122.4 appears to be a real gate contact similar or identical to the contact element 122.1.

The transistor structure 102.3 may be similar or identical to the transistor structure 102.1/102.2 except that the actual design of the transistor structure 102.3 is camouflaged with a fake gate contact and a fake source/drain contact. In addition, the transistor structure 102.3 can be implemented to include a p-channel transistor. The transistor structure 102.3 includes a gate dielectric GD3, a poly gate segment PG3, a plurality of source/drain regions SD31 and SD32 and a plurality of contact elements 122.7-122.9. The source/drain regions SD31 and SD32, located at opposite sides of the poly gate segment PG3, may be doped with p-type dopants to form P+ doped regions in the semiconductor substrate 101. The gate dielectric GD3, the poly gate segment PG3 and the contact element 122.7 can be used to implement at least a portion of a gate structure of the transistor structure 102.3. The source/drain region SD31 and the contact element 122.8 can be used to implement at least a portion of a source/drain structure of the transistor structure 102.3. The source/drain region SD32 and the contact element 122.9 can be used to implement at least a portion of another source/drain structure of the transistor structure 102.3.

In the present embodiment, a plurality of conductive portions 120.7-120.9 of the conductive layer 120 can be formed on the transistor structure 102.3. The contact element 122.8 can serve as a source/drain contact, which is arranged to electrically connect the source/drain region SD31 to the conductive portion 120.8. The contact element 122.7, arranged to electrically isolate the poly gate segment PG3 from the conductive portion 120.7, can fake a gate contact disposed on the poly gate segment PG3. The contact element 122.9, arranged to electrically isolate the source/drain region SD32 from the conductive portion 120.9, can fake a source/drain contact disposed on the source/drain region SD32. For example, a height of the non-conductive segment 122.7b is much less than a height of the conductive segment 122.7a, and a height of the non-conductive segment 122.9b is much less than a height of the conductive segment 122.9a. When viewed from a top of the conductive layer 120, or a plane cutting through the contact elements 122.7-122.9, in a stage of delayering in a reverse engineering process, the contact element 122.7 appears to be a real gate contact similar or identical to the contact element 122.1, and the contact element 122.9 appears to be a real source/drain contact similar or identical to the contact element 122.8.

The transistor structure 102.4 may be similar or identical to the transistor structure 102.3 except that each contact element can serve as a real contact. The transistor structure 102.4 includes a gate dielectric GD4, a poly gate segment PG4, a plurality of source/drain regions SD41 and SD42 and a plurality of contact elements 122.10-122.12. The gate dielectric GD4, the poly gate segment PG4 and the contact element 122.10 can be used to implement at least a portion of a gate structure of the transistor structure 102.3. The source/drain region SD41 and the contact element 122.11 can be used to implement at least a portion of a source/drain structure of the transistor structure 102.4. The source/drain region SD42 and the contact element 122.12 can be used to implement at least a portion of another source/drain structure of the transistor structure 102.4. In addition, a plurality of conductive portions 120.10-120.12 of the conductive layer 120 can be formed on the transistor structure 102.4. In the present embodiment, the contact element 122.10 can serve as a gate contact, which is arranged to electrically connect the poly gate segment PG4 to the conductive portion 120.10. The contact element 122.11 can serve as a source/drain contact, which is arranged to electrically connect the source/drain region SD41 to the conductive portion 120.11. The contact element 122.12 can serve as a source/drain contact, which is arranged to electrically connect the source/drain region SD42 to the conductive portion 120.12.

In the present embodiment, at least one of the interconnect structures 103.1 and 103.2 may include one or more fake contacts to camouflage the actual design thereof. For example, the interconnect structure 103.1 may include a plurality of conductive portions 130.1 and 140.1, and a plurality of contact elements 132.1 and 142.1. The conductive portion 130.1 is located in a conductive layer 130, which may be a second metal layer (M1) formed over the transistor layer 110. The conductive portion 140.1 is located in a conductive layer 140, which may be a third metal layer (M2) formed over the transistor layer 110. The contact element 132.1, serving as a real interlayer contact disposed between the conductive portion 120.6 and the conductive portion 130.1, can be implemented as a conductive through via or other types of conductive structures. The contact element 132.1 can be formed using conductive material(s), such as Cu, Al, Ti, Ta, W, Nb, Mo, TiN, TiC, TaN, Ti/W, Ti/TiN, any other known conductive or semi-conductive materials, or combinations thereof.

The contact element 142.1, formed on the conductive portion 130.1 and in contact with the conductive portion 140.1, is arranged to electrically isolate the conductive portion 130.1 from the conductive portion 140.1. The contact element 142.1 can fake an interlayer contact disposed between the conductive layers 130 and 140. For example, the contact element 142.1 may include a conductive segment 142.1a and a non-conductive segment 142.1b stacked one upon the other. A height of the non-conductive segment 142.1*b* is much less than a height of the conductive segment 142.1*a*. As a result, when viewed from a top of the conductive layer 140, or a plane between the conductive layer 130 and the conductive layer 140, in a stage of delayering in a reverse engineering process, the contact element 142.1 appears to be a real interlayer contact. In some embodiments, the structure of the contact element 142.1 can be similar or identical to that of the contact element 122.3/122.4/122.7/122.9. Similar description is therefore not repeated here for brevity.

The interconnect structure 103.2 may include a plurality of conductive portions 130.2, 130.3 and 140.2, and a plurality of contact elements 132.2, 132.3 and 142.3. Each of the conductive portions 130.2 and 130.3 is located in the conductive layer 130. The conductive portion 140.2 is located in the conductive layer 140. The contact element 132.2, serving as a real interlayer contact disposed between the conductive portion 120.11 and the conductive portion 130.2, can be implemented as a conductive through via or other types of conductive structures. The contact element 142.2, serving as a real interlayer contact disposed between the conductive portion 130.3 and the conductive portion 140.2, can be implemented as a conductive through via or other types of conductive structures. Each of the contact elements 132.2 and 142.2 can be formed using conductive material(s), such as Cu, Al, Ti, Ta, W, Nb, Mo, TiN, TiC, TaN, Ti/W, Ti/TiN, any other known conductive or semiconductive materials, or combinations thereof.

The contact element 132.3, formed on the conductive portion 120.12 and in contact with the conductive portion 130.3, is arranged to electrically isolate the conductive portion 120.12 from the conductive portion 130.3. The contact element 132.3 can fake an interlayer contact disposed between the conductive layers 130 and 140. For example, the contact element 132.3 may include a conductive segment 132.3*a* and a non-conductive segment 132.3*b* stacked one upon the other. A height of the non-conductive segment 132.3*b* is much less than a height of the conductive segment 132.3*a*. As a result, when viewed from a top of the conductive layer 130, or a plane between the conductive layer 120 and the conductive layer 130, in a stage of delayering in a reverse engineering process, the contact element 132.3 appears to be a real interlayer contact. In some embodiments, the structure of the contact element 132.3 can be similar or identical to that of the contact element 122.3/122.4/122.7/122.9/142.1. Similar description is therefore not repeated here for brevity.

It is worth noting that as FIG. 1 shows a cross-sectional view of the semiconductor structure 100, the semiconductor substrate 101 can be regarded as extending in an XY plane, and each contact element can be regarded as extending in a direction substantially perpendicular to the XY plane, e.g. a direction parallel to a Z-axis.

The semiconductor structure 100 shown in FIG. 1 is provided for illustrative purposes, and is not intended to limit the scope of the present disclosure. In some embodiments, one or more interlayer dielectrics may be formed between two adjacent layers of the transistor layer 110 and the conductive layers 120-140. In some embodiments, at least one of the transistor structures 102.1-102.4 can be implemented as a planar transistor structure or a three-dimensional transistor structure. In some embodiments, at least one real contact and at least one fake contact can be formed on a same poly gate segment, a same source/drain region or a same conductive portion in a conductive layer, thereby camouflaging the actual design and functionality of a semiconductor device. In some embodiments, at least a portion of the semiconductor structure 100 shown in FIG. 1 can be employed to implement a semiconductor device utilizing a universal gate design, thereby making it more difficult for an attacker to identify the actual design and functionality of the semiconductor device. The universal gate design may be, but is not limited to, a NAND gate design, a NOR gate design, a NOT gate, a multiplexer design or other types of universal gate designs.

To facilitate understanding of the present disclosure, some embodiments associated with a multiplexer cell are given in the following for further description of a semiconductor device having a camouflage design. Those skilled in the art should appreciate that a camouflage design employing real and fake contacts can be used to implement other types of universal gates without departing from the scope of the present disclosure.

Figure 2:
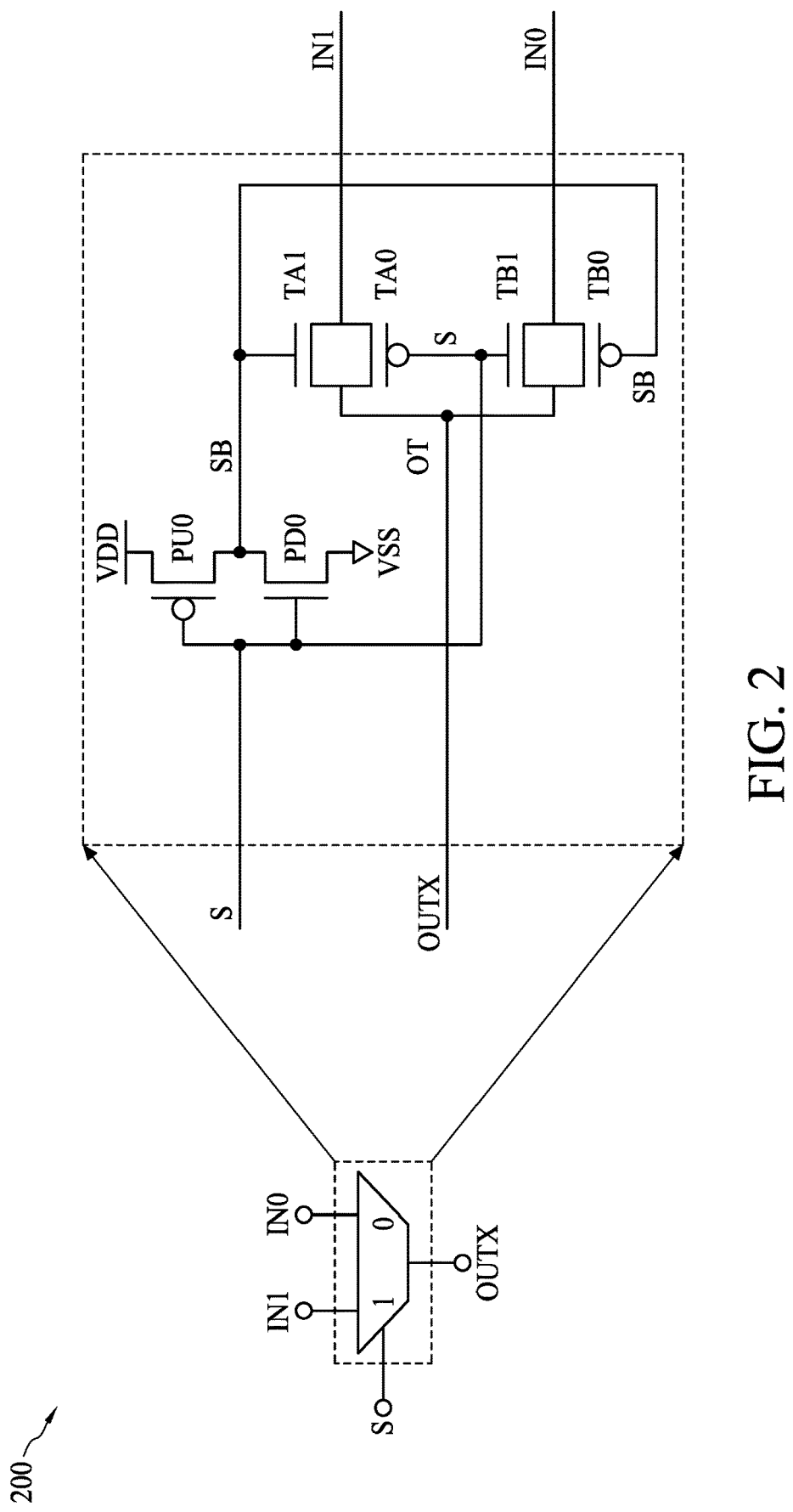
FIG. 2 is a circuit diagram of an exemplary multiplexer cell in accordance with some embodiments of the present disclosure.

Referring first to FIG. 2, a circuit diagram of an exemplary multiplexer cell is illustrated in accordance with some embodiments of the present disclosure. In the present embodiment, the multiplexer cell 200 may be implemented as a 2-to-1 multiplexer, which includes a plurality of input terminals IN0 and IN1, a select terminal S and an output terminal OUTX. The multiplexer cell 200 is configured to select one of an input signal at the input terminal IN0 and an input signal at the input terminal IN1 as an output signal at the output terminal OUTX according to an input signal at the select terminal S.

The multiplexer cell 200 may further include a plurality of transistors PU0, PD0, TA0, TA1, TB0 and TB1. Each of the transistors PU0, TA0 and TB0 can be implemented using a p-channel transistor. Each of the transistors PD0, TA1 and TB1 can be implemented using an n-channel transistor. In the present embodiment, the transistors PU0 and PD0 can be implemented as a pair of transistors. Respective gates of the transistors PU0 and PD0 are coupled to the select terminal S. Respective sources of the transistors PU0 and PD0 are coupled to a supply voltage VDD and a supply voltage VSS, respectively. Respective drains of the transistors PU0 and PD0 are coupled to a connection terminal SB. As a result, the transistors PU0 and PD0 can act as an inverter.

The transistors TA0 and TA1 can be implemented as a pair of transistors. In the present embodiment, respective gates of the transistors TA0 and TA1 are coupled to the select terminal S and the connection terminal SB, respectively. Respective sources of the transistors TA0 and TA1 are coupled to the input terminal IN1. Respective drains of the transistors TA0 and TA1 are coupled to a connection terminal OT, which is coupled to the output terminal OUTX. As a result, the transistors TA0 and TA1 can act as a transmission gate. Similarly, the transistors TB0 and TB1 can be implemented as a pair of transistors. Respective gates of the transistors TB0 and TB1 are coupled to the connection terminal SB and the select terminal S, respectively. Respective sources of the transistors TB0 and TB1 are coupled to the input terminal IN0. Respective drains of the transistors TB0 and TB1 are coupled to the connection terminal OT. As a result, the transistors TB0 and TB1 can act as a transmission gate.

It is worth noting that the multiplexer cell 200 can act as a universal gate, which is capable of implementing various standard logic gates in different operating scenarios. FIG. 3A to FIG. 3G illustrate different logic gates implemented using the multiplexer cell 200 shown in FIG. 2 in accordance with some embodiment of the present disclosure. Firstly, in the embodiment shown in FIG. 3A, the select terminal S, the input terminal IN1 and the input terminal IN0 are coupled to an input signal B, an input signal A and an input signal at a logic low level, respectively. A Boolean expression for an output signal of the multiplexer cell 200 would be A·B. The multiplexer cell 200 can therefore act as an AND gate. In the embodiment shown in FIG. 3B, the select terminal S, the input terminal IN1 and the input terminal N0 are coupled to the input signal B, the input signal A and an input signal at a logic high level, respectively. The Boolean expression for the output signal would be A+B. The multiplexer cell 200 can therefore act as an OR gate. In the embodiment shown in FIG. 3C, the select terminal S, the input terminal IN1 and the input terminal IN0 are coupled to the input signal A, an input signal at a logic low level and an input signal at a logic high level, respectively. The Boolean expression for the output signal of the multiplexer cell 200 would be expressed as an inverted signal of the input signal A. The multiplexer 200 can therefore act as a NOT gate or an inverter.

In the embodiment shown in FIG. 3D, the select terminal S, the input terminal IN1 and the input terminal IN0 are coupled to the input signal A, an inverted signal B# of the input signal B and an input signal at a logic high level, respectively. The Boolean expression for the output signal of the multiplexer cell 200 would be expressed as the inverse of the Boolean expression for the AND gate shown in FIG. 3A. As a result, the multiplexer cell 200 can act as a NAND gate. It is worth noting that the inverted signal B# of the input signal B can be produced using the NOT gate shown in FIG. 3C. In the embodiment shown in FIG. 3E, the select terminal S, the input terminal IN1 and the input terminal IN0 are coupled to the input signal A, an input signal at a logic low level and the inverted signal B# of the input signal B, respectively. The Boolean expression for the output signal of the multiplexer cell 200 would be expressed as the inverse of the Boolean expression for the OR gate shown in FIG. 3B. As a result, the multiplexer cell 200 can act as a NOR gate.

In the embodiment shown in FIG. 3F, the select terminal S, the input terminal IN1 and the input terminal IN0 are coupled to the input signal B, an inverted signal A# of the input signal A and the input signal A, respectively. The multiplexer cell 200 can act as an XOR gate. It is worth noting that the inverted signal A# of the input signal A can be produced using the NOT gate shown in FIG. 3C. In the embodiment shown in FIG. 3G, the select terminal S, the input terminal IN1 and the input terminal IN0 are coupled to the input signal B, the input signal A and the inverted signal A# of the input signal A, respectively. The multiplexer cell 200 can act as an XNOR gate.

Figure 4A:
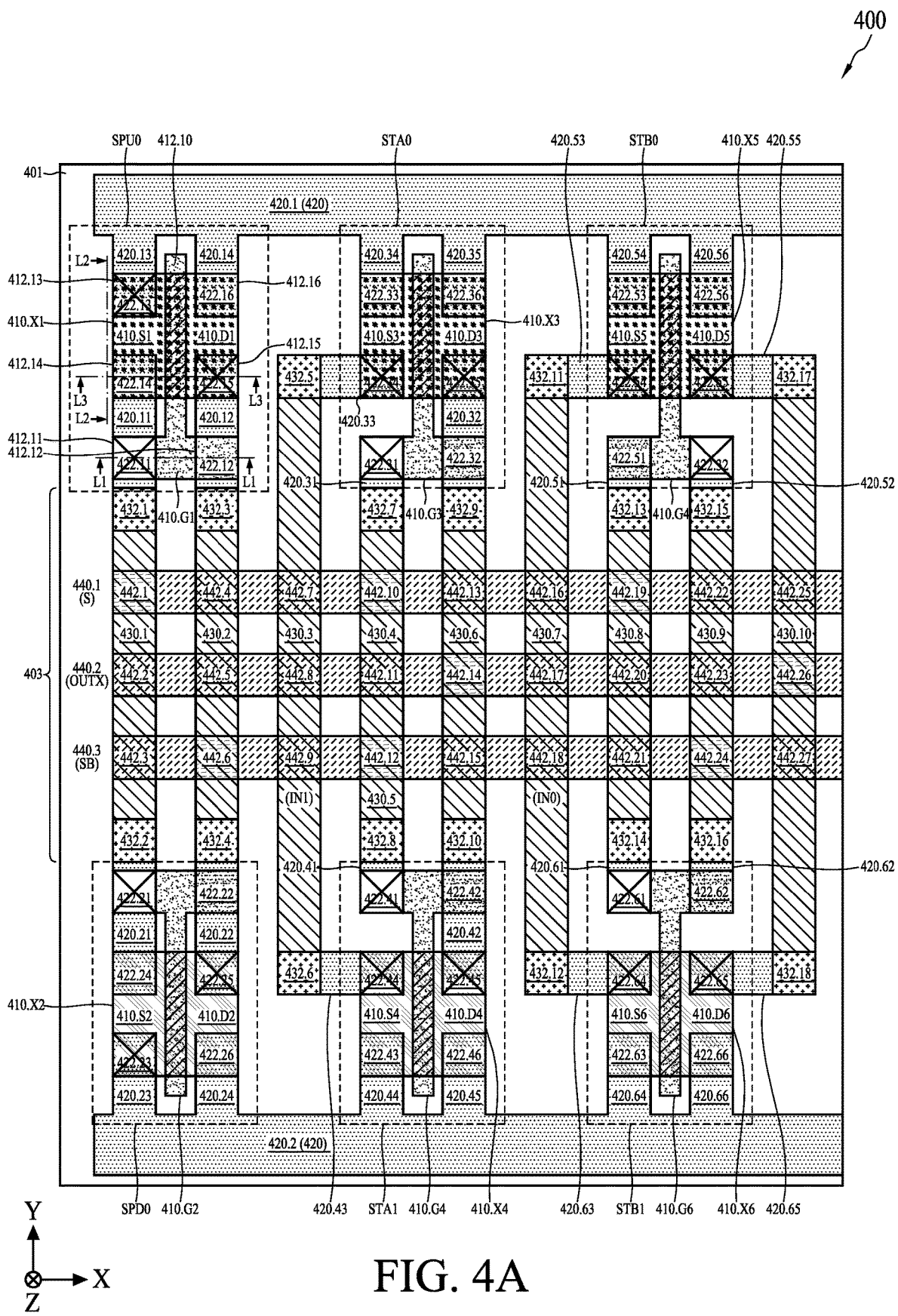
FIG. 4A illustrates an exemplary layout design of a semiconductor device is illustrated in accordance with some embodiments of the present disclosure.

With the aid of a camouflage design, which can be implemented using real contacts and fake contacts described with reference to the semiconductor structure 100 shown in FIG. 1, the multiplexer cell 200 shown in FIG. 2 can be implemented by a semiconductor device capable of hiding a logic function thereof. Referring to FIG. 4A, an exemplary layout design of a semiconductor device 400 is illustrated in accordance with some embodiments of the present disclosure. The semiconductor device 400 can employ a camouflage design implemented using at least one of the contact elements 122.1-122.12, 132.1-132.3, 142.1 and 142.2 shown in FIG. 1, thereby implementing the multiplexer cell 200 shown in FIG. 2. In the present embodiment, the semiconductor device 400 may include a plurality of transistor structures SPU0, SPD0, STA0, STA1, STB0 and STB1, an interconnect structure 403 and a conductive layer 420. The transistor structures SPU0, SPD0, STA0, STA1, STB0 and STB1 can be used to implement the transistors PU0, PD0, PGA0, PGA1, PGB0 and PGB1 shown in FIG. 2, respectively. The interconnect structure 403 can be coupled to the input terminals IN0 and IN1, the select terminal S and the output terminal OUTX shown in FIG. 2. The interconnect structure 403 can be arranged to interconnect the transistor structures SPU0, SPD0, STA0, STA1, STB0 and STB1 through the conductive layer 420, which may be an embodiment of the conductive layer 120 shown in FIG. 1.

Each of the transistor structures SPU0, SPD0, STA0, STA1, STB0 and STB1 can be formed on a semiconductor substrate 401 of the semiconductor device 400. The semiconductor substrate 401 can be used to implement an embodiment of the semiconductor substrate 101 shown in FIG. 1. It is worth noting that FIG. 1 shows a cross-sectional view of the semiconductor structure 100 while FIG. 2 shows a top layout view of the semiconductor device 400. As a result, the semiconductor substrate 401 can be regarded as extending in an XY plane, and each contact element of the semiconductor device 400 can be regarded as extending in a direction substantially perpendicular to the XY plane, e.g. a direction parallel to the Z-axis. In addition, at least a portion of a layout design of the transistor structure SPU0/STA0/STB0 can represent an embodiment of a layout design of the transistor structure 102.3/102.4 shown in FIG. 1. At least a portion of a layout design of the transistor structure SPD0/STA1/STB1 can represent an embodiment of a layout design of the transistor structure 102.1/102.2 shown in FIG. 1.

The transistor structure SPU0 includes, but is not limited to, a poly gate segment 410.G1, an active region 410.X1 and a plurality of contact elements 422.11-422.16. The poly gate segment 410.G1, used to implement the gate of the transistor PU0 shown in FIG. 2, can be an embodiment of the poly gate segment PG3/PG4 shown in FIG. 1. In the present embodiment, the poly gate segment 410.G1 is formed on the semiconductor substrate 401, and extends across the active region 410.X1 in a direction parallel to a Y-axis.

The active region 410.X1, where a channel of the transistor structure SPU0 can be formed, may include a plurality of diffusion regions 410.S1 and 410.D1 located at opposite sides of the ploy gate segment 410.G1. The diffusion regions 410.S1 and 410.D1 can be embodiments of the source/drain regions SD31 and SD32 shown in FIG. 1, or embodiments of the source/drain regions SD41 and SD42 shown in FIG. 1. In the present embodiment, the diffusion regions 410.S1 and 410.D1, doped with p-type dopants, can be used to implement the source and the drain of the transistor PU0 shown in FIG. 2.

A plurality of conductive lines 420.11-420.14, each of which is a conductive portion of the conductive layer 420, can be formed over the poly gate segment 410.G1 and the active region 410.X1. In the present embodiment, the conductive line 420.11 is arranged to cross over a portion 412.11 of the poly gate segment 410.G1. The conductive line 420.12, separate from the conductive line 420.11, is arranged to cross over a portion 412.12 of the poly gate segment 410.G1. The portions 412.11 and 412.12 may be arranged in a direction different from the direction in which the poly gate segment 410.G1 extends across the active region 410.X1. For example, the poly gate segment 410.G1 may include a portion 412.10 extending in a direction parallel to the Y-axis. The portions 412.11 and 412.12 may be arranged in a direction parallel to an X-axis. In the present embodiment, the conductive lines 420.11 and 420.12 can further extend over a portion 412.14 of the diffusion region 410.S1 and a portion 412.15 of the diffusion region 410.D1, respectively. In some embodiments, each of the conductive lines 420.11 and 420.12 may extend along a direction parallel to the Y-axis.

The conductive line 420.13 is arranged to cross over a portion 412.13 of the diffusion region 410.S1. The conductive line 420.14 is arranged to cross over a portion 412.16 of the diffusion region 410.D1. Each of the conductive lines 420.13 and 420.14 may extend along a direction parallel to the Y-axis. In the present embodiment, the conductive lines 420.13 and 420.14 can be electrically connected to each other through a conduction portion 420.1 of the conductive layer 420. The conduction portion 420.1 is coupled to the supply voltage VDD shown in FIG. 2.

Each of the contact elements 422.11-422.16 can be an embodiment of one of the contact elements 122.1-122.12 shown in FIG. 1. In the present embodiment, the contact elements 422.11 and 422.12 are formed on the poly gate segment 410.G1 and spaced apart from each other. The contact elements 422.11 and 422.12 can be arranged on the poly gate segment 410.G1 in a direction parallel to the X-axis, which is perpendicular to a direction in which the poly gate segment 410.G1 extends across the active region 410.X1. It is worth noting that the contact elements 422.11 and 422.12 appear to two gate contacts disposed on the poly gate segment 410.G1 when viewed from a top of the conductive layer 420. However, one of the contact elements 422.11 and 422.12 can be implemented as a fake gate contact or a camouflaged gate contact, which is arranged to electrically isolate the poly gate segment 410.G1 from the conductive layer 420.

Figure 4B:
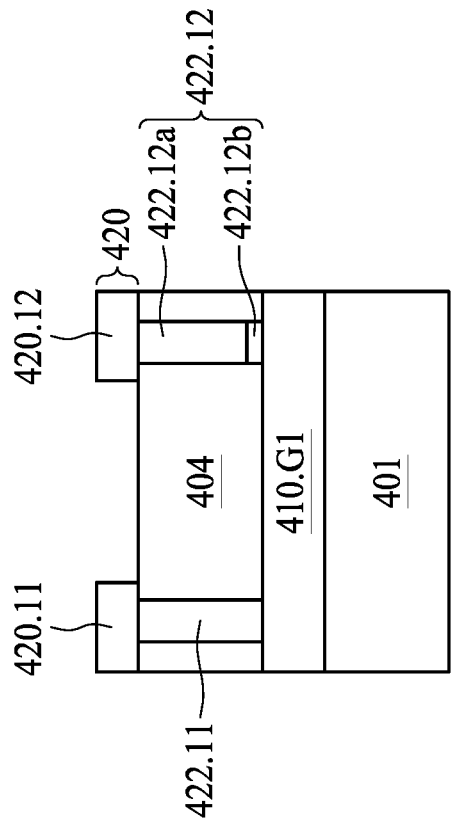
FIG. 4B to FIG. 4D illustrate cross-sectional views taken along different lines in FIG. 4A in accordance with some embodiments of the present disclosure.

FIG. 4B illustrates a cross-sectional view taken along a line L1-L1 in FIG. 4A in accordance with some embodiments of the present disclosure. Referring to FIG. 4B and also to FIG. 4A, the contact elements 422.11 and 422.12 can be implemented as a real gate contact and a fake gate contact disposed on the poly gate segment 410.G1, respectively. The contact element 422.11, formed in a dielectric layer 404 between the poly gate segment 410.G1 and the conductive line 420.11, is arranged to electrically connect the poly gate segment 410.G1 to the conductive line 420.11. The contact element 422.11 can be implemented as a conductive through via or other types of conductive structures. The contact element 422.11 can be formed using conductive material(s), such as Cu, Al, Ti, Ta, W, Nb, Mo, TiN, TiC, TaN, Ti/W, Ti/TiN, any other known conductive or semi-conductive materials, or combinations thereof. The contact element 422.12, formed in the dielectric layer 404, is arranged to electrically isolate the poly gate segment 410.G1 from the conductive line 420.12. The contact element 422.12 may include a conductive segment 422.12a and a non-conductive segment 422.12b stacked one upon the other. The conductive segment 422.12a can be implemented as a conductive through via or other types of conductive structures formed on the non-conductive segment 422.12b. The non-conductive segment 422.12b may be implemented as an insulating film or other types of insulating structures. The non-conductive segment 422.12b can be formed using insulating material(s), such as silicon oxide, silicon nitride, silicon oxynitride, metal oxide, metal nitride, other types of insulating materials, or combinations thereof. As the non-conductive segment 422.12b may have a height/thickness much less than that of the conductive segment 422.12a, the contact element 422.12 appears to be a real gate contact similar or identical to the contact element 422.11 when viewed from the top of the conductive layer 420.

Referring back to FIG. 4A, the contact elements 422.13 and 422.14, formed on different portions of the diffusion region 410.S1 and spaced apart from each other, appear to two source contacts disposed on the diffusion region 410.S1 when viewed from the top of the conductive layer 420. However, one of the contact elements 422.13 and 422.14, i.e. the contact element 422.14 in the present embodiment, is a fake source contact arranged to electrically isolate the diffusion region 410.S1 from the conductive layer 420. Similarly, the contact elements 422.15 and 422.16, formed on the diffusion region 410.D1 and spaced apart from each other, appear to two drain contacts disposed on the diffusion region 410.D1 when viewed from the top of the conductive layer 420. One of the contact elements 422.15 and 422.16, i.e. the contact element 422.16 in the present embodiment, is a fake drain contact arranged to electrically isolate the diffusion region 410.D1 from the conductive layer 420.

Figure 4D:
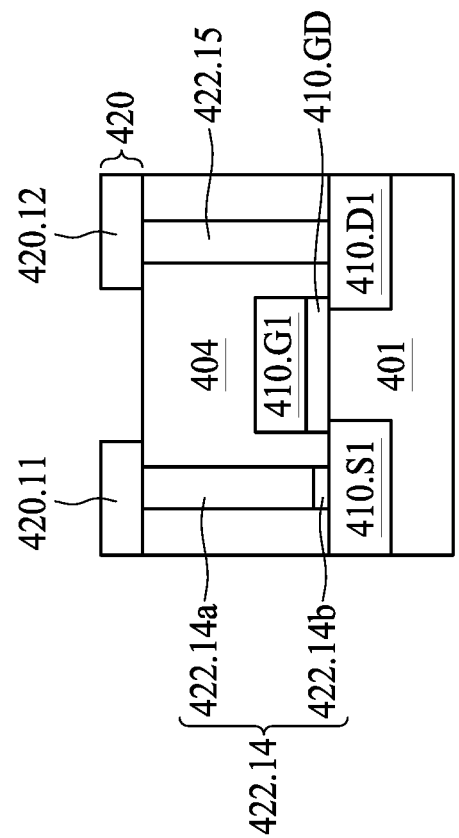
Figure 4C:
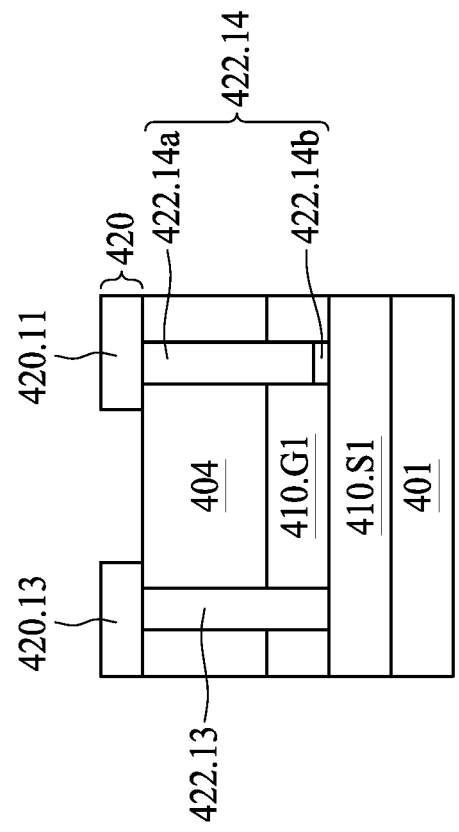

FIG. 4C illustrates a cross-sectional view taken along a line L2-L2 in FIG. 4A in accordance with some embodiments of the present disclosure. Referring to FIG. 4C and also to FIG. 4A, the contact element 422.13 can be formed in the dielectric layer 404 between the diffusion region 410.S1 and the conductive line 420.13. The contact element 422.13 is arranged to electrically connect the diffusion region 410.S1 to the conductive line 420.13, thereby serving as a real source contact disposed on the diffusion region 410.S1. The contact element 422.14, formed in the dielectric layer 404, is arranged to electrically isolate the diffusion region 410.S1 from the conductive line 420.11, thereby serving as a fake source contact disposed on the diffusion region 410.S1. In the present embodiment, the contact element 422.11, the contact element 422.13 and the contact element 422.14 can be arranged in a direction parallel to the Y-axis. The contact elements 422.11 and 422.14 are in contact with different portions of the conductive line 420.11.

The contact element 422.13 can be implemented as a conductive through via or other types of conductive structures. The contact element 422.14 may include a conductive segment 422.14a and a non-conductive segment 422.14b stacked one upon the other. The conductive segment 422.14a can be implemented as a conductive through via or other types of conductive structures formed on the non-conductive segment 422.14b. The non-conductive segment 422.14b may be implemented as an insulating film or other types of insulating structures. As the non-conductive segment 422.14b may have a height/thickness much less than that of the conductive segment 422.14a, the contact element 422.14 appears to be a real source contact similar or identical to the contact element 422.13 when viewed from the top of the conductive layer 420.

In some embodiments, a cross-sectional view of the contact elements 422.15 and 422.16 can be similar or identical to that shown in FIG. 4C. For example, the contact element 422.15 can be implemented as a conductive through via or other types of conductive structures. The contact element 422.16 may include a conductive segment and a non-conductive segment stacked one upon the other. As another example, the contact element 422.12, the contact element 422.15 and the contact element 422.16 can be arranged in a direction parallel to the Y-axis. The contact elements 422.12 and 422.15 are in contact with different portions of the conductive line 420.12. As those skilled in the art can appreciate that the cross-sectional structure of the contact elements 422.15 and 422.16 can be similar to or identical to the cross-sectional structure shown in FIG. 4C, similar description is not repeated here for brevity.

FIG. 4D illustrates a cross-sectional view taken along a line L3-L3 in FIG. 4A in accordance with some embodiments of the present disclosure. Referring to FIG. 4D and also to FIG. 4A, the contact elements 422.14 and 422.15, formed the dielectric layer 404, can be located at opposite sides of the poly gate segment 410.G1. A gate dielectric 410.GD can be formed between the poly gate segment 410.G1 and the active region 410.X1. The contact element 422.14, serving as a fake source contact, can be formed under and in contact with the conductive line 420.11. The contact element 422.15, serving as a real drain contact, can be formed under and in contact with the conductive line 420.12.

In some embodiments, the transistor structure SPD0 can be similar or identical to the transistor structure SPU0. Referring again to FIG. 4A, respective layouts of the transistor structures SPU0 and SPD0 can be symmetrical with respect to the interconnect structure 403. The transistor structure SPD0 may include a poly gate segment 410.G2, an active region 410.X2 and a plurality of contact elements 422.21-422.26. The poly gate segment 410.G2, which is similar or identical to the poly gate segment 410.G1, can be used to implement the gate of the transistor PD0 shown in FIG. 2. The active region 410.X2 can be similar or identical to the active region 410.X1 except that diffusion regions 410.S2 and 410.D2 thereof can be doped with n-type dopants. The diffusion regions 410.S2 and 410.D2 can be used to implement the source and the drain of the transistor PD0 shown in FIG. 2, respectively.

A plurality of conductive lines 420.21-420.24, each of which is a conductive portion of the conductive layer 420, can be formed over the poly gate segment 410.G2 and the active region 410.X2. A layout of the conductive lines 420.21-420.24 and a layout of the conductive lines 420.11-420.14 can be symmetrical with respect to the interconnect structure 403. In addition, the conductive lines 420.23 and 420.24 can be electrically connected to each other through a conduction portion 420.2 of the conductive layer 420. The conduction portion 420.2 is coupled to the supply voltage VSS shown in FIG. 2.

Each of the contact elements 422.21-422.26 can be an embodiment of one of the contact elements 122.1-122.12 shown in FIG. 1. A layout of the contact elements 422.21-422.26 and a layout of the contact elements 422.11-422.16 can be symmetrical with respect to the interconnect structure 403. As a result, the contact elements 422.21 and 422.22 can be a real gate contact and a fake gate contact disposed on the poly gate segment 410.G2, respectively. The contact elements 422.23 and 422.24 can be a real source contact and a fake source contact disposed on the diffusion region 410.S2, respectively. The contact elements 422.25 and 422.26 can be a real drain contact and a fake drain contact disposed on the diffusion region 410.D2, respectively.

In addition, the transistor structure STA0 can be similar or identical to the transistor structure SPU0 except for a conductive line layout, a real contact layout and a fake contact layout. In the present embodiment, the transistor structure STA0 may include a poly gate segment 410.G3, an active region 410.X3 and a plurality of contact elements 422.31-422.36. The poly gate segment 410.G3, which is similar or identical to the poly gate segment 410.G1, can be used to implement the gate of the transistor TA0 shown in FIG. 2. The active region 410.X3 can be similar or identical to the active region 410.X1. Diffusion regions 410.S3 and 410.D3 of the active region 410.X3 can be used to implement the source and the drain of the transistor TA0 shown in FIG. 2, respectively.

A plurality of conductive lines 420.31-420.35, each of which is a conductive portion of the conductive layer 420, can be formed over the poly gate segment 410.G3 and the active region 410.X3. A layout of the conductive lines 420.31-420.35 is similar or identical to a layout of the conductive lines 420.11-420.14 except that the conductive line 420.31, extending over a portion of the poly gate segment 410.G3, is separate from the conductive line 420.33 which extends over the diffusion region 410.S3. In the present embodiment, the conductive line 420.33 can extend in a direction perpendicular to the Y-axis.

Each of the contact elements 422.31-422.36 can be an embodiment of one of the contact elements 122.1-122.12 shown in FIG. 1. A layout of the contact elements 422.31-422.36 can be similar or identical to a layout of the contact elements 422.11-422.16 except for a real/fake contact arrangement. In the present embodiment, the contact elements 422.31 and 422.32 can be a real gate contact and a fake gate contact disposed on the poly gate segment 410.G3, respectively. The contact elements 422.33 and 422.34 can be a fake source contact and a real source contact disposed on the diffusion region 410.S3, respectively. The contact elements 422.35 and 422.36 can be a real drain contact and a fake drain contact disposed on the diffusion region 410.D3, respectively.

Respective layouts of the transistor structures STA0 and STA1 can be symmetrical with respect to the interconnect structure 403. In the present embodiment, the transistor structure STA1 may include a poly gate segment 410.G4, an active region 410.X4 and a plurality of contact elements 422.41-422.46. The poly gate segment 410.G4, which is similar or identical to the poly gate segment 410.G2, can be used to implement the gate of the transistor TA1 shown in FIG. 2. The active region 410.X4 can be similar or identical to the active region 410.X2. Diffusion regions 410.S4 and 410.D4 can be used to implement the source and the drain of the transistor TA1 shown in FIG. 2, respectively.

A plurality of conductive lines 420.41-420.45, each of which is a conductive portion of the conductive layer 420, can be formed over the poly gate segment 410.G4 and the active region 410.X4. A layout of the conductive lines 420.41-420.45 and a layout of the conductive lines 420.31-420.35 can be symmetrical with respect to the interconnect structure 403. Each of the contact elements 422.41-422.46 can be an embodiment of one of the contact elements 122.1-122.12 shown in FIG. 1. A layout of the contact elements 422.41-422.46 and a layout of the contact elements 422.31-422.36 can be symmetrical with respect to the interconnect structure 403. As a result, the contact elements 422.41 and 422.42 can be a real gate contact and a fake gate contact disposed on the poly gate segment 410.G4, respectively. The contact elements 422.43 and 422.44 can be a fake source contact and a real source contact disposed on the diffusion region 410.S4, respectively. The contact elements 422.45 and 422.46 can be a real drain contact and a fake drain contact disposed on the diffusion region 410.D4, respectively.

The transistor structure STB0 can be similar or identical to the transistor structure STA0 except for a conductive line layout, a real contact layout and a fake contact layout. In the present embodiment, the transistor structure STA1 may include a poly gate segment 410.G5, an active region 410.X5 and a plurality of contact elements 422.51-422.56. The poly gate segment 410.G5, which is similar or identical to the poly gate segment 410.G3, can be used to implement the gate of the transistor TA1 shown in FIG. 2. The active region 410.X5 can be similar or identical to the active region 410.X3. Diffusion regions 410.S5 and 410.D5 of the active region 410.X5 can be used to implement the source and the drain of the transistor TA1 shown in FIG. 2, respectively.

A plurality of conductive lines 420.51-420.56, each of which is a conductive portion of the conductive layer 420, can be formed over the poly gate segment 410.G5 and the active region 410.X5. A layout of the conductive lines 420.51-420.56 is similar or identical to a layout of the conductive lines 420.31-420.35 except that the conductive line 420.52, extending over a portion of the poly gate segment 410.G5, is separate from the conductive line 420.55 which extends over the diffusion region 410.D5. In the present embodiment, the conductive line 420.55 can extend in a direction perpendicular to the Y-axis.

Each of the contact elements 422.51-422.56 can be an embodiment of one of the contact elements 122.1-122.12 shown in FIG. 1. A layout of the contact elements 422.51-422.56 can be similar or identical to a layout of the contact elements 422.31-422.36 except for a real/fake contact arrangement. In the present embodiment, the contact elements 422.51 and 422.52 can be a fake gate contact and a real gate contact disposed on the poly gate segment 410.G5, respectively. The contact elements 422.53 and 422.54 can be a fake source contact and a real source contact disposed on the diffusion region 410.S5, respectively. The contact elements 422.55 and 422.56 can be a real drain contact and a fake drain contact disposed on the diffusion region 410.D5, respectively.

Respective layouts of the transistor structures STB0 and STB1 can be symmetrical with respect to the interconnect structure 403. In the present embodiment, the transistor structure STB1 may include a poly gate segment 410.G6, an active region 410.X6 and a plurality of contact elements 422.61-422.66. The poly gate segment 410.G6, which is similar or identical to the poly gate segment 410.G4, can be used to implement the gate of the transistor TB1 shown in FIG. 2. The active region 410.X6 can be similar or identical to the active region 410.X4. Diffusion regions 410.S6 and 410.D6 can be used to implement the source and the drain of the transistor TB1 shown in FIG. 2, respectively.

A plurality of conductive lines 420.61-420.66, each of which is a conductive portion of the conductive layer 420, can be formed over the poly gate segment 410.G6 and the active region 410.X6. A layout of the conductive lines 420.61-420.66 and a layout of the conductive lines 420.51-420.56 can be symmetrical with respect to the interconnect structure 403. Each of the contact elements 422.61-422.66 can be an embodiment of one of the contact elements 122.1-122.12 shown in FIG. 1. A layout of the contact elements 422.61-422.66 and a layout of the contact elements 422.51-422.56 can be symmetrical with respect to the interconnect structure 403. As a result, the contact elements 422.61 and 422.62 can be a real gate contact and a fake gate contact disposed on the poly gate segment 410.G4, respectively. The contact elements 422.63 and 422.64 can be a fake source contact and a real source contact disposed on the diffusion region 410.S6, respectively. The contact elements 422.65 and 422.66 can be a real drain contact and a fake drain contact disposed on the diffusion region 410.D6, respectively.

The interconnect structure 403 can be located between each pair of transistors. For example, the transistors SPU0, STA0 and STB0 are located at one side of the interconnect structure 403, while the transistors SPD0, STA1 and STB1 are located at an opposite side of the interconnect structure 403. In the present embodiment, the interconnect structure 403 can be arranged to electrically connect each gate structure of the transistor structures SPU0 and SPD0 to the select terminal S. Also, the interconnect structure 403 can be arranged to electrically connect each source/drain structure of the transistor structures STA0 and STA1, such as each source of the transistors PGA0 and PGA1 shown in FIG. 2, to the input terminal IN1. The interconnect structure 403 can be further arranged to electrically connect each source/drain structure of the transistor structures STB0 and STB1, such as each source of the transistors PGB0 and PGB1 shown in FIG. 2, to the input terminal IN0.

The interconnect structure 403 may include a plurality of conductive lines 430.1-430.10, a plurality of contact elements 432.1-432.18, a plurality of conductive lines 440.1-440.3, and a plurality of contact elements 442.1-442.27. In some embodiments, each of the conductive lines 430.1-430.10 can extend in a first direction parallel to the Y-axis. Each of the conductive lines 440.1-440.3 can extend in a second direction different from the first direction. For example, the second direction may be parallel to the X-axis.

The conductive lines 430.1-430.10 can be formed in a same conductive layer and separate from each other. Each of the conductive lines 430.1-430.10 can be electrically connected to at least one conductive line in the conductive layer 420. In the present embodiment, the conductive lines 430.1-430.10 can be formed at a level higher than the conductive layer 420. Each of the contact elements 432.1-432.18, disposed on a conductive line in the conductive layer 420, can be formed using conductive material(s) to electrically connect the conductive line in the conductive layer 420 to one of the conductive lines 430.1-430.10.

For example, the conductive lines 430.1 can be electrically connected to the conductive lines 420.11 and 420.21 through the contact elements 432.1 and 432.2, respectively. The conductive lines 430.2 can be electrically connected to the conductive lines 420.12 and 420.22 through the contact elements 432.3 and 432.4, respectively. The conductive lines 430.3 can be electrically connected to the conductive lines 420.33 and 420.43 through the contact elements 432.5 and 432.6, respectively. It is worth noting that, in some embodiments where the conductive lines 430.1-430.10 can be implemented as a portion of the conductive layer 420, the contact elements 432.1-432.18 may be omitted.

The conductive lines 440.1-440.3 can be formed at a level different from each of the conductive lines 430.1-430.10. Each of the contact elements 442.1-442.27 can be formed between one of the conductive lines 430.1-430.10 and one of the conductive lines 440.1-440.3. In the present embodiment, each of the conductive lines 440.1-440.3 is formed at a level higher than each of the conductive lines 430.1-430.10. By way of example but not limitation, each of the conductive lines 440.1-440.3 are formed in a conductive layer such as a third metal layer (M2), and each of the conductive lines 430.1-430.10 can be formed in a conductive layer such as a second metal layer (M1).

Each of the contact elements 442.1-442.27 can be formed on one of the conductive lines 430.1-430.10 and in contact with one of the conductive lines 440.1-440.3.

Each of the contact elements 442.1-442.27 can be implemented as a real contact or a fake contact according to a circuit topology corresponding to the semiconductor device 400. In the present embodiment, the conductive lines 440.1-440.3 can be coupled to the select terminal S, the output terminal OUTX and the connection terminal SB shown in FIG. 2, respectively. Firstly, with regard to connection between the transistor structures SPU0 and SPD0, the contact elements 442.1-442.3 are formed on different portions of the conductive line 430.1 where the conductive lines 440.1-440.3 cross over, respectively. The contact elements 442.4-442.6 are formed on different portions of the conductive line 430.2 where the conductive lines 440.1-440.3 cross over, respectively. To implement an inverter including the transistors PU0 and PD0 shown in FIG. 2, each of the contact elements 442.1 and 442.6 can be formed using conductive material(s) to serve as a real contact. As a result, each of the poly gate segments 410.G1 and 410.G2 can be electrically connected to the conductive line 440.1. Each of the diffusion regions 410.D1 and 410.D2 can be electrically connected to the conductive line 440.3. In addition, each of the contact elements 442.2-442.5 can be formed to include a conductive segment and a non-conductive segment stacked on upon the other, thereby serving as a fake contact.

With regard to connection between the transistor structures STA0 and STA1, each of the contact elements 442.10, 442.12 and 442.14 can be formed using conductive material(s) to serve as a real contact. Each of the contact elements 442.7-442.9, 442.11, 442.13 and 442.15 can be formed to include a conductive segment and a non-conductive segment stacked on upon the other, thereby serving as a fake contact. As a result, the transistor structures STA0 and STA1 can implement a transmission gate including the transistors TA0 and TA1 shown in FIG. 2. The interconnect structure 403 can be arranged to electrically connect each source/drain structure of the structures STA0 and STA1, such as each drain of the transistors PGA0 and PGA1 shown in FIG. 2, to the output terminal OUTX. In the present embodiment, the conductive line 430.3, electrically connected to the diffusion regions 410.S3 and 410.S4, can be coupled to the input terminal IN1 shown in FIG. 2.

With regard to connection between the transistor structures STB0 and STB1, each of the contact elements 442.19, 442.24 and 442.26 can be formed using conductive material(s) to serve as a real contact. Each of the contact elements 442.16-442.18, 442.20-442.23, 442.25 and 442.27 can be formed to include a conductive segment and a non-conductive segment stacked on upon the other, thereby serving as a fake contact. As a result, the transistor structures STB0 and STB1 can implement a transmission gate including the transistors TB0 and TB1 shown in FIG. 2. The interconnect structure 403 can be arranged to electrically connect each source/drain structure of the structures STB0 and STB1, such as each drain of the transistors PGB0 and PGB1 shown in FIG. 2, to the output terminal OUTX. In the present embodiment, the conductive line 430.7, electrically connected to the diffusion regions 410.S5 and 410.S6, can be coupled to the input terminal IN0 shown in FIG. 2.

The structures shown in FIG. 4A-4D are provided for illustrative purposes, and are not intended to limit the scope of the present disclosure. In some embodiments, at least one of the poly gate segments 410.G1-410.G6 can be replaced with other types of conductive segments. In some embodiments, more than two contact elements can be formed on a same poly gate segment or a same source/drain region. In some embodiments, the number of conductive lines crossing over the conductive lines 430.1-430.10 can be greater or smaller than three. In some embodiments, a layout design of the transistor structures STA0 and STA1 can be identical to that of the transistor structures STB0 and STB1.

Figure 5:
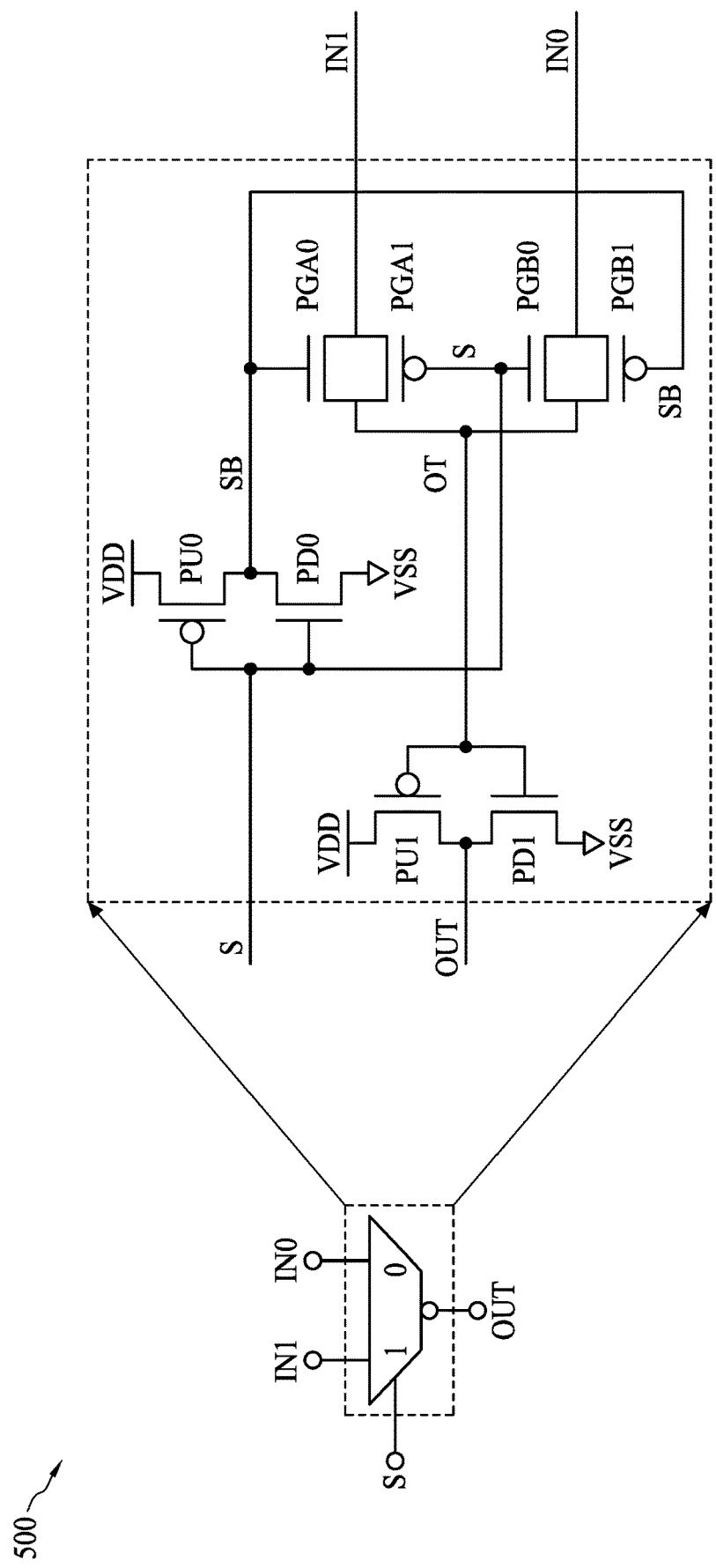
FIG. 5 is a circuit diagram of an exemplary multiplexer cell in accordance with some embodiments of the present disclosure.

In some embodiments, a camouflaged semiconductor structure described above can be used to implement a multiplexer having other possible circuit topologies. FIG. 5 is a circuit diagram of an exemplary multiplexer cell in accordance with some embodiments of the present disclosure. The multiplexer cell 500 is configured to select one an input signal at the input terminal IN0 and an input signal at the input terminal IN1 as an output signal at the output terminal OUT according to an input signal at the select terminal S.

The circuit topology of the multiplexer cell 500 can be identical to that of the multiplexer cell 200 shown in FIG. 2 except for a plurality of transistors PU1 and PD1. In the present embodiment, the transistors PU1 and PD1 can be implemented using a p-channel transistor and an n-channel transistor, respectively. Respective gates of the transistors PU1 and PD1 are coupled to the connection terminal OT. Respective sources of the transistors PU1 and PD1 are coupled to the supply voltages VDD and VSS, respectively. Respective drains of the transistors PU1 and PD1 are coupled to the output terminal OUT. It is worth noting that the multiplexer cell 500 can be equivalent to an inverter followed by the multiplexer cell 200 shown in FIG. 2.

Similarly, the multiplexer cell 500 can act as a universal gate, which is capable of implementing various standard logic gates in different operating scenarios. FIG. 6A to FIG. 6G illustrate different logic gates implemented using the multiplexer cell 500 shown in FIG. 5 in accordance with some embodiment of the present disclosure. As those skilled in the art can understand logic functions in operating scenarios shown in FIG. 6A to FIG. 6G after reading the above paragraphs directed to FIG. 5A to FIG. 5G, similar description is not repeated here for brevity.

Figure 7:
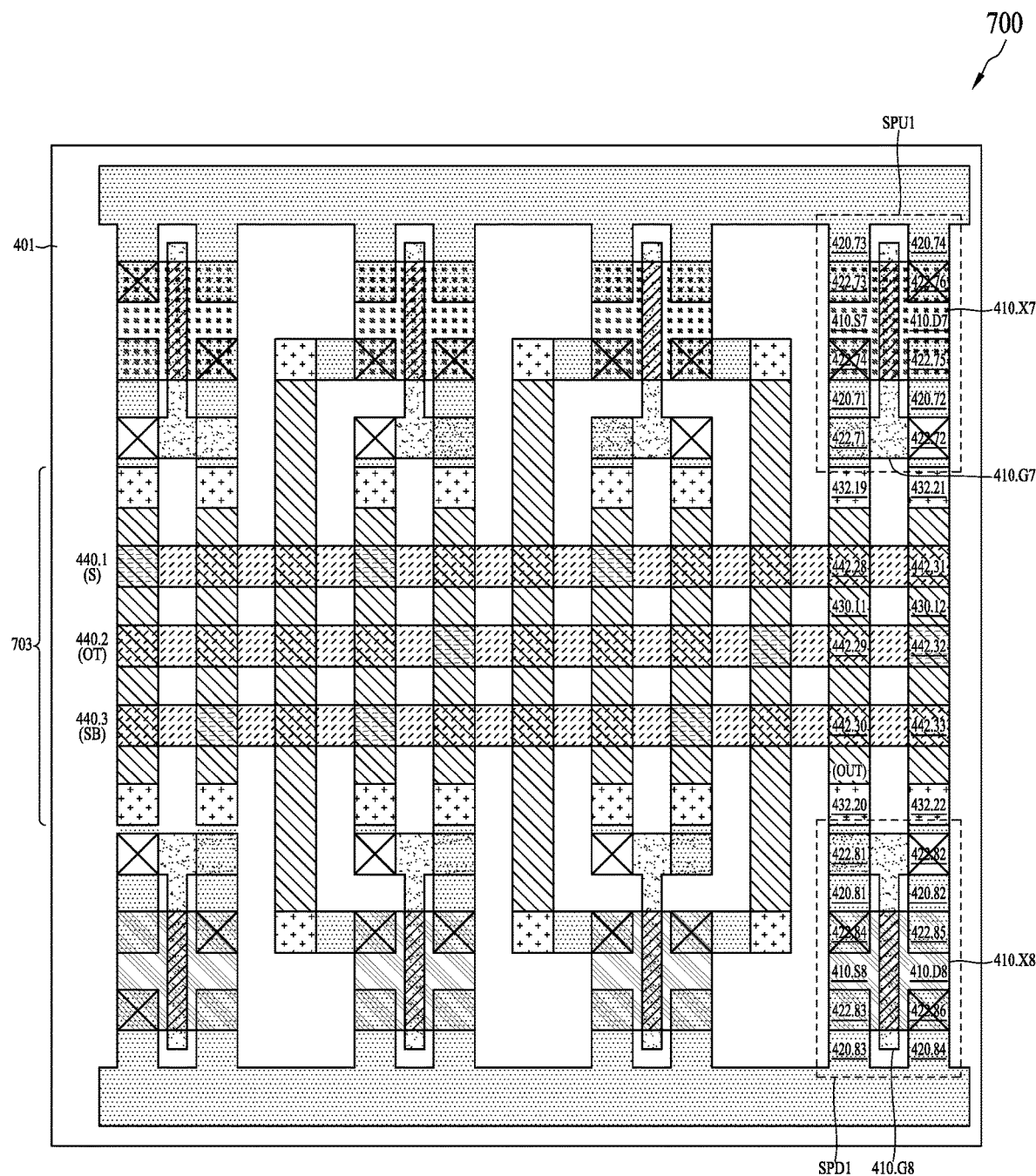
FIG. 7 illustrates an exemplary layout design of a semiconductor device in accordance with some embodiments of the present disclosure.

Referring to FIG. 7, an exemplary layout design of a semiconductor device 700 is illustrated in accordance with some embodiments of the present disclosure. The semiconductor device 700 can be used to implement the multiplexer cell 500 shown in FIG. 5. The semiconductor device 700 can be similar to or identical to the semiconductor device 400 shown in FIG. 4A except for a plurality transistor structures SPU1 and SPD1 and an interconnect structure 703. The transistor structures SPU1 and SPD1 can be used to implement the transistors PU1 and PD1 shown in FIG. 5, respectively.

The transistor structure SPU1 can be similar or identical to the transistor structure SPU0 except for contact layouts. For example, respective real/fake contact arrangements of the transistor structures SPU0 and SPU1 can be symmetrical with respect to the conductive line 430.7. In the present embodiment, the transistor structure SPU1 may include a poly gate segment 410.G7, an active region 410.X7 and a plurality of contact elements 422.71-422.76. The poly gate segment 410.G7 can be used to implement the gate of the transistor PU1 shown in FIG. 5. Diffusion regions 410.S7 and 410.D7 of the active region 410.X7 can be used to implement the source and the drain of the transistor PU1 shown in FIG. 5, respectively.

A plurality of conductive lines 420.71-420.74, each of which is a conductive portion of the conductive layer 420 shown in FIG. 4, can be formed over the poly gate segment 410.G7 and the active region 410.X7. A layout of the conductive lines 420.71-420.74 can be similar or identical to the layout of the conductive lines 420.11-420.14. Each of the contact elements 422.71-422.76 can be an embodiment of one of the contact elements 122.1-122.12 shown in FIG. 1. In the present embodiment, the contact elements 422.71 and 422.72 can be a fake gate contact and a real gate contact disposed on the poly gate segment 410.G7, respectively. The contact elements 422.73 and 422.74 can be a fake source contact and a real source contact disposed on the diffusion region 410.S7, respectively. The contact elements 422.75 and 422.76 can be a fake drain contact and a real drain contact disposed on the diffusion region 410.D7, respectively.

Respective layouts of the transistor structures SPU1 and SPD1 can be symmetrical with respect to the interconnect structure 703. In the present embodiment, the transistor structure SPD1 may include a poly gate segment 410.G8, an active region 410.X8 and a plurality of contact elements 422.81-422.86. The poly gate segment 410.G8 can be used to implement the gate of the transistor PD1 shown in FIG. 5. The active region 410.X8 can be similar or identical to the active region 410.X8. Diffusion regions 410.S8 and 410.D8 can be used to implement the source and the drain of the transistor PD1 shown in FIG. 5, respectively.

A plurality of conductive lines 420.81-420.84, each of which is a conductive portion of the conductive layer 420 shown in FIG. 4, can be formed over the poly gate segment 410.G8 and the active region 410.X8. A layout of the conductive lines 420.81-420.84 and a layout of the conductive lines 420.71-420.74 can be symmetrical with respect to the interconnect structure 703. Each of the contact elements 422.81-422.86 can be an embodiment of one of the contact elements 122.1-122.12 shown in FIG. 1. A layout of the contact elements 422.81-422.86 and a layout of the contact elements 422.71-422.76 can be symmetrical with respect to the interconnect structure 703. As a result, the contact elements 422.81 and 422.82 can be a fake gate contact and a real gate contact disposed on the poly gate segment 410.G8, respectively. The contact elements 422.83 and 422.84 can be a fake source contact and a real source contact disposed on the diffusion region 410.S8, respectively. The contact elements 422.85 and 422.86 can be a fake drain contact and a real drain contact disposed on the diffusion region 410.D8, respectively.

The interconnect structure 703 can be similar to or identical to the interconnect structure 403 shown in FIG. 4A except that the interconnect structure 703 may further include a plurality conductive lines 430.11 and 430.12, a plurality of contact elements 432.19-432.22, and a plurality of contact elements 442.28-442.33. Each of the conductive lines 430.11 and 430.12, located at a level equal to the conductive lines 430.1-430.10, can extend in a direction parallel to the Y-axis. Each of the contact elements 432.19-432.22, disposed on a conductive line in the conductive layer 420, can be formed using conductive material(s) to electrically connect the conductive line in the conductive layer 420 to one of the conductive lines 430.11 and 430.12.

In addition, the contact element 442.32 can be formed using conductive material(s) to serve as a real contact. Each of the contact elements 442.28-442.31 and 442.33 can be formed to include a conductive segment and a non-conductive segment stacked on upon the other, thereby serving as a fake contact. As a result, each of the diffusion regions 410.D7 and 410.D8 can be electrically connected to the conductive line 440.3, which is coupled to the connection terminal OT shown in FIG. 5. Each of the diffusion regions 410.S7 and 410.S8 can be coupled to the output terminal OUT shown in FIG. 5 in the present embodiment. The transistor structures SPU1 and SPD1 can therefore implement an inverter including the transistors PU1 and PD1 shown in FIG. 5. The interconnect structure 703 can be arranged to electrically connect each source/drain structure of the structures SPU1 and SPD1, such as each drain of the transistors PU1 and PD1 shown in FIG. 5, to the output terminal OUT. As those skilled in the art can understand the semiconductor structure shown in FIG. 7 after reading the above paragraphs directed to FIG. 4A to FIG. 4D, similar description is not repeated here for brevity.

Figure 8:
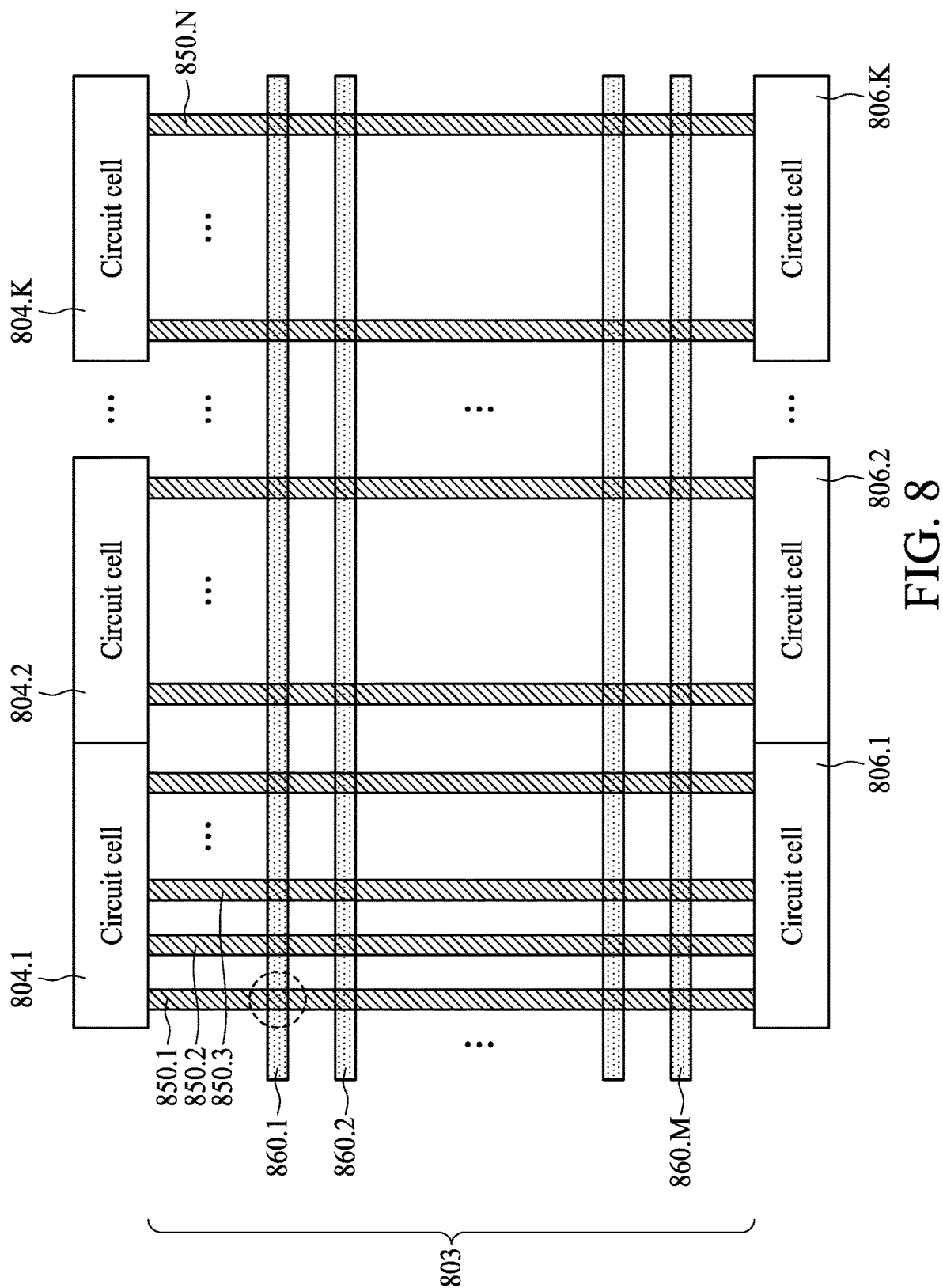
FIG. 8 illustrates an exemplary semiconductor device in accordance with some embodiments of the present disclosure.

FIG. 8 illustrates an exemplary semiconductor device in accordance with some embodiments of the present disclosure. The semiconductor device 800 can utilize semiconductor structures described with reference to FIG. 1 to FIG. 7 to hide functionality thereof. In the present embodiment, the semiconductor device 800 may include K circuit cells 804.1-804.K, K circuit cells 806.1-806.K and an interconnect structure 803, wherein K is a positive integer. At least one of the circuit cells 804.1-804.K and 806.1-806.K can be implemented using a universal gate having a camouflage design. For example, each of the circuit cells 804.1-804.K and 806.1-806.K can be implemented using the semiconductor device 400 shown in FIG. 4A or the semiconductor device 700 shown in FIG. 7.

The interconnect structure 803 may include N conductive lines 850.1-850.N, M conductive lines 860.1-860.M and a plurality of contact elements CE. Each of N and M is a positive integer. The conductive lines 850.1-850.N, located in a same conductive layer, are connected to the circuit cells 804.1-804.K and 806.1-806.K. Each circuit cell can be implemented as a logic circuit or a universal logic gate. By way of example but not limitation, in some embodiments where the circuit cell 804.1 is implemented using the semiconductor device 400 shown in FIG. 4A, the conductive lines 440.1-440.3 shown in FIG. 4A can be electrically connected to the conductive lines 850.1-850.3 connected to the circuit cell 804.1. It is worth noting that number of conductive lines connected to each circuit cell can be determined according to a circuit design of the circuit cell.

The conductive lines 860.1-860.M can be formed at a level different from each of the conductive lines 850.1-850.N. Each of the contact elements CE, formed between one of the conductive lines 850.1-850.N and one of the conductive lines 860.1-860.M, can be an embodiment of one of the contact elements 122.1-122.12 shown in FIG. 1. In the present embodiment, each of the conductive lines 860.1-860.M is formed at a level higher than each of the conductive lines 850.1-850.N. Each of the contact elements CE can be formed on one of the conductive lines 850.1-850.N and in contact with one of the conductive lines 860.1-860.M. It is worth noting that each of the contact elements CE can be implemented as a real contact or a fake contact according to a circuit topology corresponding to the semiconductor device 800. As a result, it would be quite difficult for an attacker to identify the actual design and functionality of the semiconductor device 800.

Figure 9:
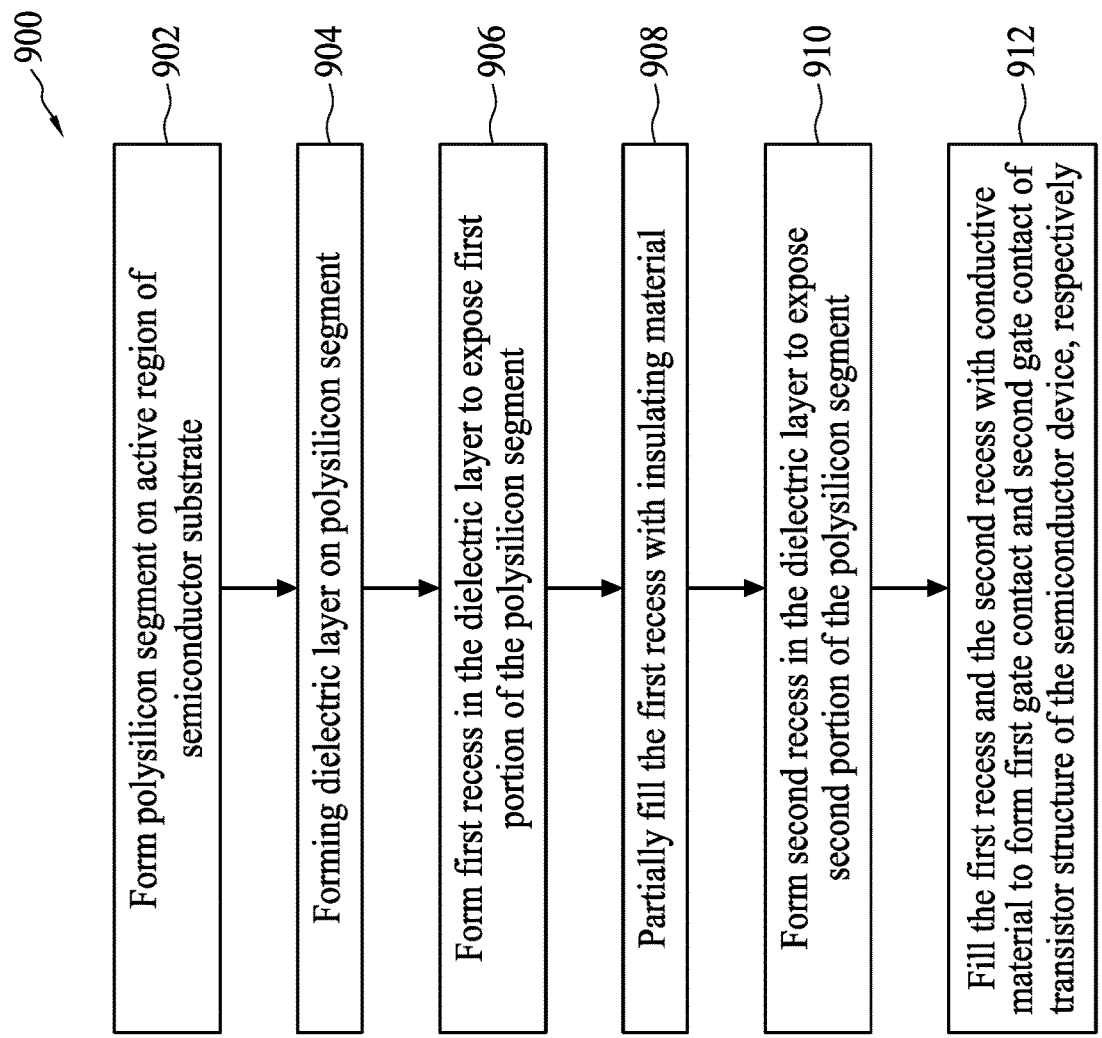
FIG. 9 is a flow chart of a method for forming a semiconductor device in accordance with some embodiments of the present disclosure.

FIG. 9 is a flow chart of a method for forming a semiconductor device in accordance with some embodiments of the present disclosure. For illustrative purposes, the method 900 is described with reference to the semiconductor device 400 shown in FIG. 4A. The method 900 is also described with reference to FIG. 10A to FIG. 10F, which illustrate cross sections, taken along the line L1-L1 in FIG. 4A, of corresponding structures at different stages of fabrication in accordance with some embodiments of the present disclosure. Those skilled in the art will recognize that the method 900 can be employed in other types of semiconductor devices to provide real and fake contacts without departing from the scope of the present disclosure. Additionally, in some embodiments, other operations in the method 900 can be performed. In some other embodiments, operations of the method 900 can be performed in a different order and/or vary.

At operation 902, a polysilicon segment is formed on an active region of a semiconductor substrate. The active region can be a region where a channel of a transistor structure is formed. For example, as illustrated in FIG. 4A and FIG. 10A, the poly gate segment 410.G1 is formed on the active region 410.X1 of the semiconductor substrate 401. As FIG. 10A illustrates a cross-sectional view taken along the line L1-L1 in FIG. 4A, the active region 410.X1 is not shown.

At operation 904, a dielectric layer is formed on the polysilicon segment. For example, as illustrated in FIG. 10B, the dielectric layer 404 is formed on the poly gate segment 410.G1. The dielectric layer 404 may be an inter metal dielectric layer, which may include dielectric material(s) such as silicon oxide, silicon carbon oxide, silicon nitride, silicon carbon nitride, aluminum oxide, other types of dielectric materials, or combinations thereof.

At operation 906, a first recess is formed in the dielectric layer to expose a first portion of the polysilicon segment. For example, as illustrated in FIG. 10C, the dielectric layer 404 is patterned and etched to create a recess 1006 to expose a portion of the poly gate segment 410.G1. The patterning process may include forming photoresist on the dielectric layer 404, and using a photomask to expose portions of the photoresist, and exposing a portion of the dielectric layer 404 by removing exposed or unexposed portions of the photoresist. Next, the etching process is performed to remove the exposed portion of the dielectric layer 404.

At operation 908, the first recess is partially filled with an insulating material. For example, as illustrated in FIG. 10D, the recess 1006 is partially filled with the non-conductive segment 412.12b. The non-conductive segment 412.12b can include insulating material(s), such as silicon oxide, silicon nitride, silicon oxynitride, metal oxide, metal nitride, other types of insulating materials, or combinations thereof. The non-conductive segment 412.12b can be formed using, but is not limited to, a deposition process such as thermal oxidation deposition or chemical vapor deposition.

At operation 910, a second recess is formed in the dielectric layer to expose a second portion of the polysilicon segment. For example, as illustrated in FIG. 10E, a recess 1008 is formed in the dielectric layer 404 to expose another portion of the poly gate segment 410.G1. The dielectric layer 404 can be patterned and etched to create the recess 1008 to expose the another portion of the poly gate segment 410.G1. The patterning process may include forming photoresist on the dielectric layer 404, and using a photomask to expose portions of the photoresist, and exposing another portion of the dielectric layer 404 by removing exposed or unexposed portions of the photoresist. Next, the etching process is performed to remove the another portion of the dielectric layer 404.

At operation 912, the first recess and the second recess are filled with a conductive material to form a first gate contact and a second gate contact of a transistor structure of the semiconductor device, respectively. The first gate contact includes the conductive material and the insulating material stacked one upon the other. For example, as illustrated in FIG. 10F, the recess 1006 and the recess 1008 are filled with a conductive material to form the contact element 412.12 and the contact element 412.11 of the transistor structure SPU0, respectively. The contact element 412.12 includes the conductive segment 412.12a and the non-conductive segment 412.12b stacked one upon the other.

In some embodiments, after the first recess and the second recess are filled with the conductive material, a conductive layer can be formed on the dielectric layer. Also, the conductive layer can be patterned into a plurality of conductive portions separate from each other. A first conductive portion of the conductive layer is in contact with the first gate contact, and a second conductive portion of the conductive layer is in contact with the second gate contact. For example, as illustrated in FIG. 4A and FIG. 4B, the conductive layer 420 can be formed on the dielectric layer 404, and patterned into a plurality of conductive lines. The conductive line 420.11 is in contact with the contact element 412.11, and the conductive line 420.12 is in contact with the contact element 412.12.

In some embodiments, when the first recess used for the first gat contact is formed in the dielectric layer, a third recess can be formed in the dielectric layer to expose a first portion of a source/drain region of the transistor structure. When the second recess used for the second gate contact is formed in the dielectric layer, a fourth recess can be formed in the dielectric layer to expose a second portion of the source/drain region. As a result, when the first gate contact and the second gate contact are formed, a first source/drain contact and a second source/drain contact can be formed on the source/drain region. For example, referring to FIG. 4C and FIG. 10C, a recess used for the contact element 422.14 can be formed in the dielectric layer 404 in a fabrication stage in which the recess 1006 used for the contact element 412.12 is formed. Referring to FIG. 4C and FIG. 10D, the recess used for the contact element 422.14 can be partially filled with the insulating material(s) used for partially filling the recess 1006, thereby forming the non-conductive segment 422.14b. Referring to FIG. 4C and FIG. 10E, after the non-conductive segments 422.14b and 422.12b are formed, a recess used for the contact element 422.13 can be formed in the dielectric layer 404 in a fabrication stage in which the recess 1008 used for the contact element 412.11 is formed. Referring to FIG. 4C and FIG. 10F, the recess used for the contact element 422.13 and the recess used for the contact element 422.14 can be partially filled with the conductive material(s) used for filling the recesses 1006 and 1008, thereby forming the contact elements 422.13 and 422.14 on the diffusion region 410.S1. Similarly, the contact elements 422.15 and 422.16 can be formed on the diffusion region 410.D1 according to the operations described with reference to FIG. 10C to FIG. 10F.

Figure 11:
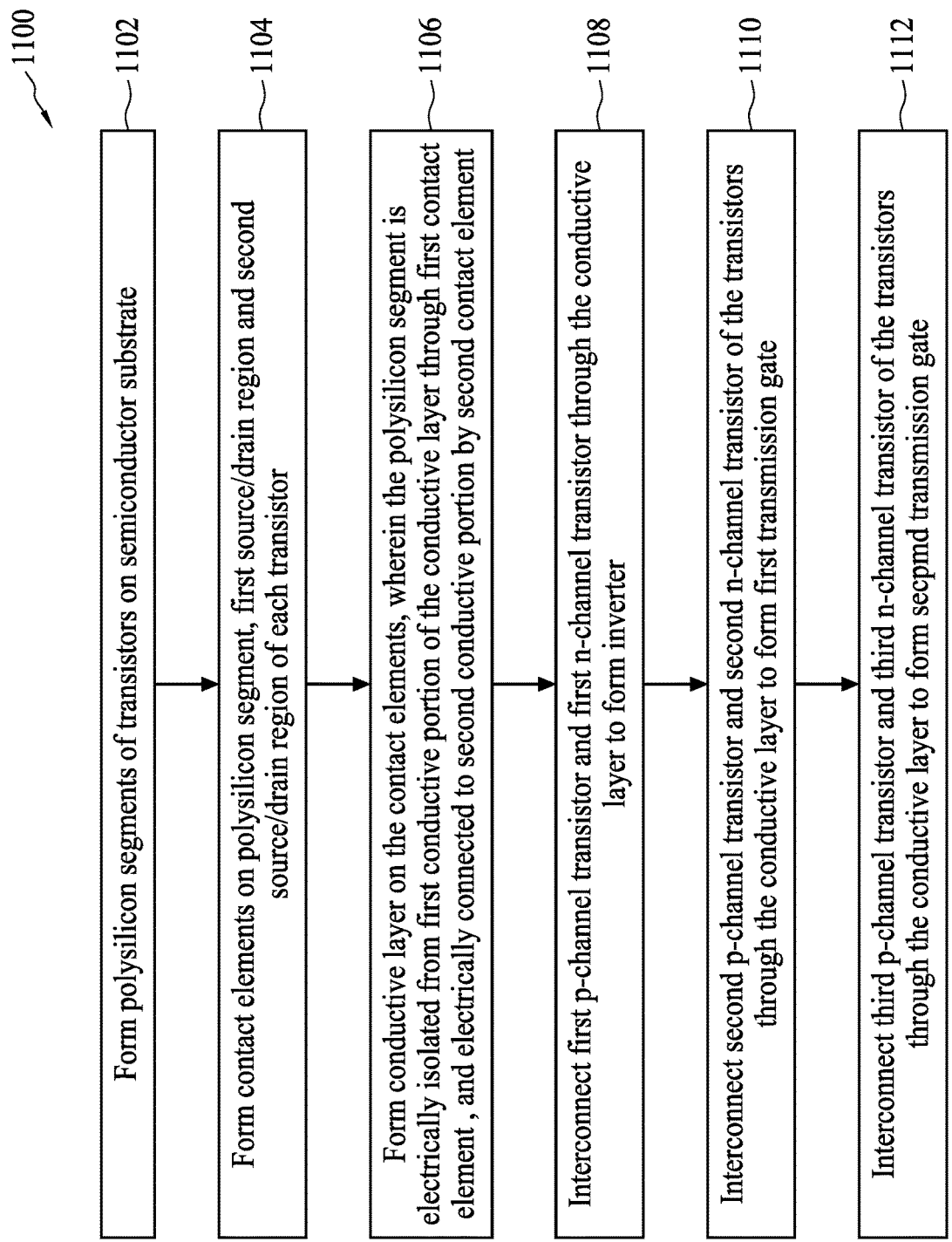
FIG. 11 is a flow chart of a method for forming a multiplexer cell in accordance with some embodiments of the present disclosure.

FIG. 11 is a flow chart of a method for forming a multiplexer cell in accordance with some embodiments of the present disclosure. For illustrative purposes, the method 1000 is described with reference to the semiconductor device 400 shown in FIG. 4A. Those skilled in the art will recognize that the method 1100 can be employed in other types of multiplexer cells, such as the multiplexer cell 500 shown in FIG. 5, without departing from the scope of the present disclosure. Additionally, in some embodiments, other operations in the method 1100 can be performed. In some other embodiments, operations of the method 1100 can be performed in a different order and/or vary.

At operation 1102, a plurality of polysilicon segments of a plurality of transistors are formed on a semiconductor substrate. The transistors include a plurality of p-channel transistors located on an upper portion of the semiconductor substrate and a plurality of n-channel transistors located on a lower portion of the semiconductor substrate. Each polysilicon segment extends across an active region of the semiconductor substrate to define a first source/drain region and a second source/drain region. For example, the respective poly gate segments 410.G1, 410.G3 and 410.G5 of the transistor structures SPU0, STA0 and STB0 can be formed on an upper portion of the semiconductor substrate 401. The respective poly gate segments 410.G2, 410.G4 and 410.G6 of the transistor structures SPD0, STA1 and STB1 can be formed on a lower portion of the semiconductor substrate 401.

At operation 1104, a plurality of contact elements are formed on the polysilicon segment, the first source/drain region and the second source/drain region of each transistor. For example, the contact elements 422.11-420.16 are formed on the poly gate segment 410.G1, the diffusion region 410.S1 and the diffusion region 410.D1. In some embodiments, operation 1104 can be performed based on operations 904-912 shown in FIG. 9.

At operation 1106, a conductive layer is formed on the contact elements. The conductive layer includes a first conductive portion and a second conductive portion separate from each other. The polysilicon segment of each transistor is electrically isolated from the first conductive portion through a first contact element of the contact elements, and electrically connected to the second conductive portion by a second contact element of the contact elements. For example, the conductive layer 420 including the conductive lines 420.11 and 420.12 are formed, wherein the conductive line 420.11 is electrically connected to the poly gate segment 410.G1 through the contact element 422.11, while the conductive line 420.12 is electrically isolated from the poly gate segment 410.G1 by the contact element 422.12.

At operation 1108, a first p-channel transistor and a first n-channel transistor of the transistors are interconnected through the conductive layer to form an inverter. For example, the interconnect structure 403 is formed to interconnect the transistor structures SPU0 and SPD0 through the conductive layer 420 to form an inverter.

At operation 1110, a second p-channel transistor and a second n-channel transistor of the transistors are interconnected through the conductive layer to form a first transmission gate. The respective polysilicon segments of the second p-channel transistor and the second n-channel transistor are electrically connected to an input and an output of the inverter, respectively. For example, the interconnect structure 403 is arranged to interconnect the transistor structures STA0 and STA1 through the conductive layer 420 to form a transmission gate. The poly gate segments 410.G3 and 410.G4 are electrically connected to the poly gate segment 410.G1/410.G2 and the diffusion region 410.D1/410.D2, respectively.

At operation 1112, a third p-channel transistor and a third n-channel transistor of the transistors are interconnected through the conductive layer to form a second transmission gate. The respective polysilicon segments of the second p-channel transistor and the second n-channel transistor are electrically connected to the output and the input of the inverter respectively. For example, the interconnect structure 403 is arranged to interconnect the transistor structures STB0 and STB1 through the conductive layer 420 to form a transmission gate. The poly gate segments 410.G5 and 410.G6 are electrically connected to the diffusion region 410.D1/410.D2 and the poly gate segment 410.G1/410.G2, respectively.

With the use of fake contacts and universal gate design, circuit cells in a semiconductor device having different logic functions can be implemented as a plurality of camouflaged circuits having a same generic layout structure, thereby effectively protecting the design intellectual property.

Some embodiments described herein may include a multiplexer cell. The multiplexer cell includes a semiconductor substrate, a conductive layer, a plurality of pairs of transistors and an interconnect structure. The conductive layer is formed over the semiconductor substrate. The pairs of transistors are formed on the semiconductor substrate. Each pair of transistors includes a p-channel transistor and an n-channel transistor. A gate structure, a first source/drain structure and a second source/drain structure of each of the p-channel transistor and the n-channel transistor are electrically connected to the conductive layer. The gate structure includes a conductive segment, a first contact element and a second contact element. The conductive segment is formed on the semiconductor substrate and extends across an active region of the semiconductor substrate. The first source/drain structure and the second source/drain structure are formed on the active region and located at opposite sides of the conductive segment. The first conductive portion and the second conductive portion of the conductive layer cross over a first portion and a second portion of the conductive segment respectively. The first contact element and the second contact element are formed on the first portion and the second portion of the conductive segment respectively. The first contact element is arranged to electrically connect the conductive segment to the first conductive portion. The second contact element is arranged to electrically isolate the conductive segment from the second conductive portion. The interconnect structure is located between each pair of transistors and electrically connected to the conductive layer. The pairs of transistors include a first pair of transistors, a second pair of transistors and a third pair of transistors. The interconnect structure is arranged to electrically connect each gate structure of the first pair of transistors, each first source/drain structure of the second pair of transistors and each first source/drain structure of the third pair of transistors to a select terminal, a first input terminal and a second input terminal of the multiplexer cell, respectively.

Some embodiments described herein may include a semiconductor device. The semiconductor device includes a conductive layer, a transistor structure and an interconnect structure. The conductive layer is formed over a semiconductor substrate. The transistor structure is formed on a first area of a semiconductor substrate. The transistor structure includes a poly gate segment, a first contact element and a second contact element. A first conductive line and a second conductive line of the conductive layer cross over a first portion and a second portion of the poly gate segment, respectively. The first contact element is formed on the first portion of the poly gate segment and in contact with the first conductive line. The second contact element is formed on the second portion of the poly gate segment and in contact with the second conductive line. The interconnect structure is formed on a second area of the semiconductor substrate different from the first area. The interconnect structure includes a third conductive line, a fourth conductive line, a plurality of fifth conductive lines, a plurality of third contact elements and a plurality of fourth contact elements. The third conductive line and the fourth conductive line are coupled to the first conductive line and the second conductive line, respectively. Each of the third conductive line and the fourth conductive line extends in a first direction. The fifth conductive lines are formed at a level different from each of the third conductive line and the fourth conductive line. Each fifth conductive line extends in a second direction different from the first direction. The third contact elements are formed on different portions of the third conductive line where the fifth conductive lines cross over, respectively. One of the third contact elements is arranged to electrically connect the third conductive line to the fifth conductive line. The fourth contact elements are formed on different portions of the fourth conductive line where the fifth conductive lines cross over, respectively. One of the fourth contact elements is arranged to electrically isolate the fourth conductive line from the fifth conductive line.

Some embodiments described herein may include a method for forming a multiplexer cell. The method includes: forming a plurality of polysilicon segments of a plurality of transistors on a semiconductor substrate, the transistors comprising a plurality of p-channel transistors located on an upper portion of the semiconductor substrate and a plurality of n-channel transistors located on a lower portion of the semiconductor substrate, each polysilicon segment extending across an active region of the semiconductor substrate to define a first source/drain region and a second source/drain region; forming a plurality of contact elements on the polysilicon segment, the first source/drain region and the second source/drain region of each transistor; forming a conductive layer on the contact elements, the conductive layer comprising a first conductive portion and a second conductive portion separate from each other, wherein the polysilicon segment is electrically isolated from the first conductive portion through a first contact element of the contact elements, and electrically connected to the second conductive portion by a second contact element of the contact elements; interconnecting a first p-channel transistor and a first n-channel transistor of the transistors through the conductive layer to form an inverter; interconnecting a second p-channel transistor and a second n-channel transistor of the transistors through the conductive layer to form a first transmission gate, wherein the respective polysilicon segments of the second p-channel transistor and the second n-channel transistor are electrically connected to an input and an output of the inverter respectively; interconnecting a third p-channel transistor and a third n-channel transistor of the transistors through the conductive layer to form a second transmission gate, wherein the respective polysilicon segments of the second p-channel transistor and the second n-channel transistor are electrically connected to the output and the input of the inverter respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multiplexer cell, comprising:
   a semiconductor substrate;
   a conductive layer, formed over the semiconductor substrate;
   a plurality of pairs of transistors, formed on the semiconductor substrate, each pair of transistors comprising a p-channel transistor and an n-channel transistor; a gate structure, a first source/drain structure and a second source/drain structure of each of the p-channel transistor and the n-channel transistor being electrically connected to the conductive layer, the gate structure comprising:
      a conductive segment, formed on the semiconductor substrate and extending across an active region of the semiconductor substrate, the first source/drain structure and the second source/drain structure being formed on the active region and located at opposite sides of the conductive segment, a first conductive portion and a second conductive portion of the conductive layer crossing over a first portion and a second portion of the conductive segment respectively;
   a first contact element and a second contact element, formed on the first portion and the second portion of the conductive segment respectively, the first contact element being arranged to electrically connect the conductive segment to the first conductive portion, the second contact element being arranged to electrically isolate the conductive segment from the second conductive portion; and
   an interconnect structure, located between each pair of transistors and electrically connected to the conductive layer, wherein the pairs of transistors comprises a first pair of transistors, a second pair of transistors and a third pair of transistors; the interconnect structure is arranged to electrically connect each gate structure of the first pair of transistors, each first source/drain structure of the second pair of transistors and each first source/drain structure of the third pair of transistors to a select terminal, a first input terminal and a second input terminal of the multiplexer cell, respectively.

2. The multiplexer cell of claim 1, wherein the conductive segment extends across the active region in a first direction; the first contact element and the second contact element are arranged on the conductive segment in a second direction perpendicular to the first direction.

3. The multiplexer cell of claim 1, wherein the second contact element comprises a conductive segment and a non-conductive segment stacked one upon the other.

4. The multiplexer cell of claim 1, wherein at least one of the first source/drain structure and the second source/drain structure comprises:
   a diffusion region formed in the active region, wherein a third conductive portion and a fourth conductive portion of the conductive layer are formed over a first portion and a second portion of the diffusion region respectively; and
   a third contact element and a fourth contact element, formed on the first portion and the second portion of the diffusion region respectively, the third contact element being arranged to electrically connect the diffusion region to the third conductive portion, the fourth contact element being arranged to electrically isolate the diffusion region from the fourth conductive portion.

5. The multiplexer cell of claim 4, wherein the conductive segment extends across the active region in a first direction; one of the first contact element and the second contact element, the third contact element and the fourth contact element are arranged in a second direction parallel to the first direction.

6. The multiplexer cell of claim 4, wherein the first conductive portion and the fourth conductive portion are electrically connected to each other.

7. The multiplexer cell of claim 4, wherein the second conductive portion and the third conductive portion are electrically connected to each other.

8. The multiplexer cell of claim 1, wherein the interconnect structure is further arranged to electrically connect each second source/drain structure of the second pair of transistors and each second source/drain structure of the third pair of transistors to an output terminal of the multiplexer cell.

9. The multiplexer cell of claim 1, wherein the pairs of transistors further comprises a fourth pair of transistors; the interconnect structure is further arranged to electrically connect each second source/drain structure of the second pair of transistors and each second source/drain structure of the third pair of transistors to each gate structure of the fourth pair of transistors, and electrically connect each first source/drain structure of the fourth pair of transistors to an output terminal of the multiplexer cell.

10. The multiplexer cell of claim 1, wherein the interconnect structure comprises:
    a third conductive portion electrically connected to the first conductive portion;

a fourth conductive portion electrically connected to the second conductive portion, the fourth conductive portion being separate from the third conductive portion;
a fifth conductive portion formed at a level higher than each of the third conductive portion and the fourth conductive portion, the fifth conductive portion crossing over the third conductive portion and the fourth conductive portion;
a third contact element, formed on the third conductive portion and in contact with the fifth conductive portion; and
a fourth contact element, formed on the fourth conductive portion and in contact with the fifth conductive portion.

11. The multiplexer cell of claim 10, wherein the third contact element is arranged to electrically connect the third conductive portion to the fifth conductive portion, and the fourth contact element is arranged to electrically isolate the fourth conductive portion from the fifth conductive portion.

12. The multiplexer cell of claim 10, wherein the third contact element is arranged to electrically isolate the third conductive portion from the fifth conductive portion, and the fourth contact element is arranged to electrically connect the fourth conductive portion to the fifth conductive portion; the second conductive portion is electrically connected to one of the first source/drain structure and the second source/drain structure.

13. The multiplexer cell of claim 10, wherein the interconnect structure further comprises:
a sixth conductive portion electrically connected between respective first source/drain structures of one of the pairs of transistors, the sixth conductive portion being separate from the each of the third conductive portion and the fourth conductive portion, the fifth conductive portion crossing over the sixth conductive portion; and
a sixth contact element, formed on the sixth conductive portion and in contact with the fifth conductive portion.

14. The multiplexer cell of claim 10, wherein the interconnect structure further comprises:
a sixth conductive portion electrically connected between respective second source/drain structures of one of the pairs of transistors, the sixth conductive portion being separate from the each of the third conductive portion and the fourth conductive portion, the fifth conductive portion crossing over the sixth conductive portion; and
a sixth contact element, formed on the sixth conductive portion and in contact with the fifth conductive portion.

15. A semiconductor device, comprising:
a conductive layer, formed over a semiconductor substrate;
a transistor structure formed on a first area of a semiconductor substrate, the transistor structure comprising:
a poly gate segment, a first conductive line and a second conductive line of the conductive layer crossing over a first portion and a second portion of the poly gate segment, respectively;
a first contact element, formed on the first portion of the poly gate segment and in contact with the first conductive line; and
a second contact element, formed on the second portion of the poly gate segment and in contact with the second conductive line; and
an interconnect structure formed on a second area of the semiconductor substrate different from the first area, the interconnect structure comprising:
a third conductive line and a fourth conductive line, coupled to the first conductive line and the second conductive line respectively, each of the third conductive line and the fourth conductive line extending in a first direction;
a plurality of fifth conductive lines, formed at a level different from each of the third conductive line and the fourth conductive line, each fifth conductive line extending in a second direction different from the first direction;
a plurality of third contact elements, formed on different portions of the third conductive line where the fifth conductive lines cross over, respectively, wherein one of the third contact elements is arranged to electrically connect the third conductive line to the fifth conductive line; and
a plurality of fourth contact elements, formed on different portions of the fourth conductive line where the fifth conductive lines cross over, respectively, wherein one of the fourth contact elements is arranged to electrically isolate the fourth conductive line from the fifth conductive line.

16. The semiconductor device of claim 15, wherein the first portion and the second portion of the poly gate segment are arranged in the second direction; the poly gate segment further comprises a third portion extending in the first direction; the transistor structure further comprises a first source/drain region and a second source/drain region located at opposite sides of the third portion of the poly gate segment.

17. The semiconductor device of claim 15, wherein the transistor structure further comprises:
a source/drain region located at one side of the poly gate segment;
a fifth contact element formed on a first portion of the source/drain region, the fifth contact element being arranged to electrically connect the first portion of the source/drain region to the conductive layer; and
a sixth contact element formed on a second portion of the source/drain region, the sixth contact element being arranged to electrically isolate the second portion of the source/drain region from the conductive layer.

18. A method for forming a multiplexer cell, comprising:
forming a plurality of polysilicon segments of a plurality of transistors on a semiconductor substrate, the transistors comprising a plurality of p-channel transistors located on an upper portion of the semiconductor substrate and a plurality of n-channel transistors located on a lower portion of the semiconductor substrate, each polysilicon segment extending across an active region of the semiconductor substrate to define a first source/drain region and a second source/drain region;
forming a plurality of contact elements on the polysilicon segment, the first source/drain region and the second source/drain region of each transistor;
forming a conductive layer on the contact elements, the conductive layer comprising a first conductive portion and a second conductive portion separate from each other, wherein the polysilicon segment is electrically isolated from the first conductive portion through a first contact element of the contact elements, and electrically connected to the second conductive portion by a second contact element of the contact elements;
interconnecting a first p-channel transistor and a first n-channel transistor of the transistors through the conductive layer to form an inverter;
interconnecting a second p-channel transistor and a second n-channel transistor of the transistors through the conductive layer to form a first transmission gate, wherein the respective polysilicon segments of the second p-channel transistor and the second n-channel transistor are electrically connected to an input and an output of the inverter respectively; and interconnecting a third p-channel transistor and a third n-channel transistor of the transistors through the conductive layer to form a second transmission gate, wherein the respective polysilicon segments of the second p-channel transistor and the second n-channel transistor are electrically connected to the output and the input of the inverter respectively.

19. The method of claim 18, wherein forming the contact elements on the polysilicon segment, the first source/drain region and the second source/drain region comprises:

forming a dielectric layer on the polysilicon segment;

forming a first recess in the dielectric layer to expose a first portion of the polysilicon segment;

partially filling the first recess with an insulating material;

forming a second recess in the dielectric layer to expose a second portion of the polysilicon segment; and filling the first recess and the second recess with a conductive material to form the first contact element and the second contact element, respectively, wherein the first gate contact comprises the conductive material and the insulating material stacked one upon the other.

20. The method of claim 19, wherein forming the contact elements on the polysilicon segment, the first source/drain region and the second source/drain region further comprises:

forming a third recess in the dielectric layer to expose a first portion of the first source/drain region;

partially filling the third recess with the insulating material;

forming a fourth recess in the dielectric layer to expose a second portion of the first source/drain region; and filling the third recess and the fourth recess with the conductive material to form a third contact element and a fourth contact element on the first source/drain region, respectively, wherein the third contact element comprises the conductive material and the insulating material stacked one upon the other.

* * * * *